United States Patent
Baniecki et al.

(10) Patent No.: US 7,491,996 B2
(45) Date of Patent: Feb. 17, 2009

(54) CAPACITIVE ELEMENT, SEMICONDUCTOR DEVICE, AND METHOD OF MANUFACTURING THE CAPACITIVE ELEMENT

(75) Inventors: John David Baniecki, Kawasaki (JP);
Takeshi Shioga, Kawasaki (JP);
Kazuaki Kurihara, Kawasaki (JP)

(73) Assignee: Fujitsu Limited, Nakahara-Ku, Kawasaki-Shi, Kanagawa (JP)

( * ) Notice: Subject to any disclaimer, the term of this patent is extended or adjusted under 35 U.S.C. 154(b) by 457 days.

(21) Appl. No.: 11/168,547

(22) Filed: Jun. 29, 2005

(65) Prior Publication Data

US 2006/0211212 A1    Sep. 21, 2006

(30) Foreign Application Priority Data

Mar. 16, 2005    (JP)    ............... 2005-075449

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/310; 257/306; 438/396

(58) Field of Classification Search .................. 257/306, 257/310, 532; 438/240, 381, 393, 396

See application file for complete search history.

(56) References Cited

U.S. PATENT DOCUMENTS

| | | | | |
|---|---|---|---|---|
| 5,691,220 A | * | 11/1997 | Ohnishi et al. | ............... 438/253 |
| 6,673,672 B2 | * | 1/2004 | Sashida | ....................... 438/253 |
| 6,806,553 B2 | | 10/2004 | Yashima et al. | |
| 2005/0094452 A1 | * | 5/2005 | Lee et al. | ..................... 365/202 |

FOREIGN PATENT DOCUMENTS

| | | |
|---|---|---|
| EP | 0 920 054 A1 | 6/1999 |
| JP | 2003-45748 | 2/2003 |
| WO | WO 98/01904 | 1/1998 |

* cited by examiner

*Primary Examiner*—Phuc T Dang
(74) *Attorney, Agent, or Firm*—Fujitsu Patent Center

(57) ABSTRACT

A capacitive element includes a base member 10, an underlying insulating film 11 formed on the base member 10, a capacitor Q constructed by forming a lower electrode 13, a capacitor dielectric film 14, and an upper electrode 15 sequentially on the underlying insulating film 11, a lower protection insulating film 16a formed on the upper electrode 15 to cover at least a part of the capacitor Q, and an upper protection insulating film 16b formed on the lower protection insulating film 16a and having a wider energy band gap than the lower protection insulating film 16a.

17 Claims, 16 Drawing Sheets

CAPACITIVE ELEMENT, SEMICONDUCTOR DEVICE, AND METHOD OF MANUFACTURING THE CAPACITIVE ELEMENT

CROSS-REFERENCE TO RELATED APPLICATIONS

This application is based on and claims priority of Japanese Patent Application No. 2005-075449 filed on Mar. 16, 2005, the entire contents of which are incorporated herein by reference.

BACKGROUND OF THE INVENTION

1. Field of the Invention

The present invention relates to a capacitive element, a semiconductor device, and a method of manufacturing the capacitive element.

2. Description of the Related Art

The semiconductor devices having various functions are used in the electronic equipments such as the high-performance server, the personal computer, the cellular phone, and so forth. When the concurrent switching noises are generated in circuits of such semiconductor devices, a voltage fluctuation or a voltage noise is caused on a power-supply line and thus it is likely that performance of the semiconductor device cannot be adequately brought out. In order to avoid such disadvantage, the multiplayer ceramic capacitor (MLC) or the thin film capacitor is embedded in the electronic equipment as the decoupling capacitor together with the semiconductor device. These capacitors are capable of effectively absorbing the voltage fluctuation or the voltage noise by increasing its capacitance, typically by employing a high-dielectric material such as BST (barium strontium titanete), lead magnesium niobate, or the like as a capacitor dielectric film.

The Patent Literature 1 prevents the peeling of the upper electrode by forming an oxygen introduced layer between the capacitor dielectric film and the upper electrode.

Also, Patent Literature 2 enhances adhesive property of a protection film by forming an adhesive layer made of Pt, Pd, or the like between the upper electrode and the protection film.

(Patent Literature 1) International Publication No. 98/01904 Pamphlet (Patent Literature 2) Patent Application Publication (KOKAI) 2003-45748

SUMMARY OF THE INVENTION

According to one aspect of the present invention, there is a provided a capacitive element that comprises a capacitor constructed by forming a lower electrode, a capacitor dielectric film, and an upper electrode sequentially on a base member; a lower protection insulating film formed on the upper electrode to cover at least a part of the capacitor; and an upper protection insulating film formed on the lower protection insulating film and having a wider energy band gap than the lower protection insulating film.

According to the results of experiments performed by the inventors of this application, it becomes apparent that the dielectric constant of the insulator is increased larger when the energy band gap becomes narrower. When the dielectric constant of the insulator is large, a penetration depth of the electron distribution from the metal into the insulator becomes deeper. Therefore, the electrons acting as binding arms of the bond between the metal and the insulator enter deeply into the inside of the insulator, and thus the adhesive strength between them is increased. For this reason, in order to enhance the adhesive strength between the metal and the insulator, the insulator having the narrow energy band gap should be employed.

In view of this, in the present invention, the protection insulating film for protecting the capacitor is formed to have the double-layered structure consisting of the lower protection insulating film and the upper protection insulating film, and the insulating film having the energy band gap that is narrower than that of the upper protection insulating film is employed as the lower protection insulating film.

Accordingly, for the above reason, the adhesive strength between the metal constituting the upper electrode and the lower protection insulating film can be improved. Therefore, the film peeling of the lower protection insulating film can be prevented effectively. As a result, the capacitor can be assuredly protected from the atmosphere containing the hydrogen, the moisture, or the like that causes the capacitor dielectric film to deteriorate, and thus the high-quality capacitive element that is able to satisfactorily maintain the high-dielectric characteristic or the ferroelectric characteristic of the capacitor dielectric film in actual use can be provided.

Also, the upper protection insulating film is formed on the lower protection insulating film to make up for the insufficient barrier characteristic of the lower protection insulating film. Therefore, the barrier characteristic and the adhesiveness can both be improved at the same time.

In addition, since the upper protection insulating film provided to play a rule of improving the barrier characteristic is formed thicker than the lower protection insulating film, the barrier characteristic against the hydrogen or the moisture can be enhanced much more.

Further, in the case where the upper electrode is formed of the noble metal, if the film having the wide energy band gap is employed as the lower protection insulating film, there is concern that the adhesive strength between the upper electrode and the protection insulating film is lowered because the noble metal has a weak reactivity with other elements. In contrast, in the present invention, even in the case where the upper electrode is formed of such noble metal, the electrons in the upper electrode are caused to easily enter into the lower protection insulating film by narrowing the energy band gap of the lower protection insulating film. As a result, the adhesive strength between the upper electrode made of the noble metal and the protection insulating film can be enhanced sufficiently.

Also, according to another aspect of the present invention, there is provided a semiconductor device that comprises a semiconductor substrate; an underlying insulating film formed on the semiconductor substrate; a capacitor constructed by forming a lower electrode, a capacitor dielectric film, and an upper electrode sequentially on the underlying insulating film; a lower protection insulating film formed on the upper electrode to cover at least a part of the capacitor; and an upper protection insulating film formed on the lower protection insulating film and having a wider energy band gap than the lower protection insulating film.

As the capacitor of the semiconductor device, there are a ferroelectric capacitor of an FeRAM (Ferroelectric Random Access Memory) and a high-dielectric capacitor of a DRAM (Dynamic Random Access Memory), for example.

According to still another aspect of the present invention, there is provided a method of manufacturing a capacitive element, which comprises the steps of forming a capacitor by forming a lower electrode, a capacitor dielectric film, and an upper electrode sequentially on a base member; forming a lower protection insulating film on the upper electrode to cover the capacitor; and forming an upper protection insulating film on the lower protection insulating film, the upper protection insulating film having an energy band gap that is wider than the lower protection insulating film.

DESCRIPTION OF THE PREFERRED EMBODIMENTS (1) Preliminary Explanation

Prior to explaining about embodiments of the present invention, preliminary explanation of the present invention will be made hereunder.

The thin film capacitor of BGA (Ball Grid Array) type is employed as various decoupling capacitors. The electrodes of the thin film capacitor are connected electrically to the solder bumps via the conductive plug in the insulating film.

Figure 1:
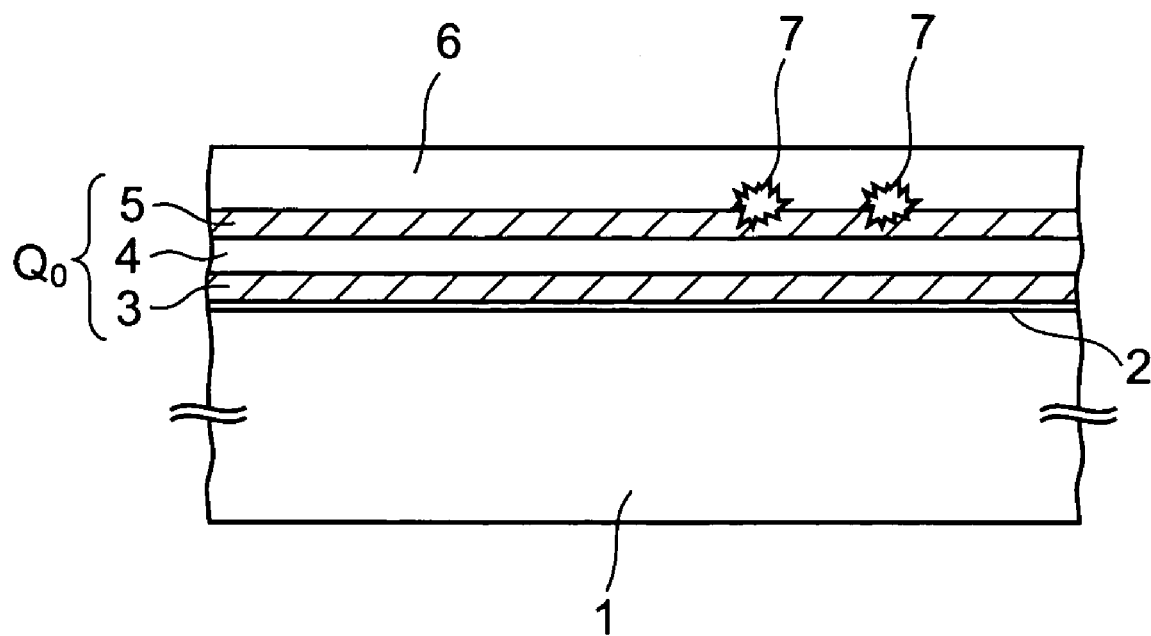
FIG. 1 is a sectional view of the capacitor that is used commonly.

FIG. 1 is a sectional view of the capacitor that is commonly used.

This capacitor $Q_0$ is formed on a thermal oxide film 2 on a surface of a silicon substrate 1, and is constructed by a lower electrode 3, a capacitor dielectric film 4, and an upper electrode 5. Each of the electrodes 3, 4 is formed of a noble metal film that is made of platinum, gold, or the like and has a thickness of about 80 nm. The capacitor dielectric film 4 is formed of a high-dielectric film that is made of $Ba_{0.3}Sr_{0.7}TiO_3$, or the like and has a thickness of about 100 nm.

In the manufacturing process or in actual use, the capacitor $Q_0$ is exposed to the atmosphere that causes the capacitor dielectric film 4 to deteriorate, e.g., the atmosphere containing the hydrogen, the moisture, or the like. For this reason, a protection film 6 for covering the capacitor $Q_0$ is formed to protect the capacitor $Q_0$ from such atmosphere.

As the material constituting the protection film 6, the insulating material whose energy band gap Eg is relatively wide, e.g., alumina ($Al_2O_3$: Eg=10 eV), silicon oxide ($SiO_2$: Eg=9 eV), silicon nitride ($Si_3N_4$: Eg=5 eV), or the like, is commonly used.

However, such material having the wide energy band gap is excellent in the barrier characteristic against the atmosphere containing hydrogen, moisture, or the like, which is harmful to the capacitor dielectric film, but is inferior in adhesion to the platinum or the gold used as the upper electrode 5 Thus, such a disadvantage is brought about that peelings 7 occur.

Focusing attention on a relationship between the width of the energy band gap and the adhesiveness of the protection film, the inventor of this application thought out the following embodiments of the present invention.

(2) First Embodiment

FIGS. 2A to 2D are sectional views showing a capacitive element according to a first embodiment of the present invention in the course of manufacturing.

Figure 2A:
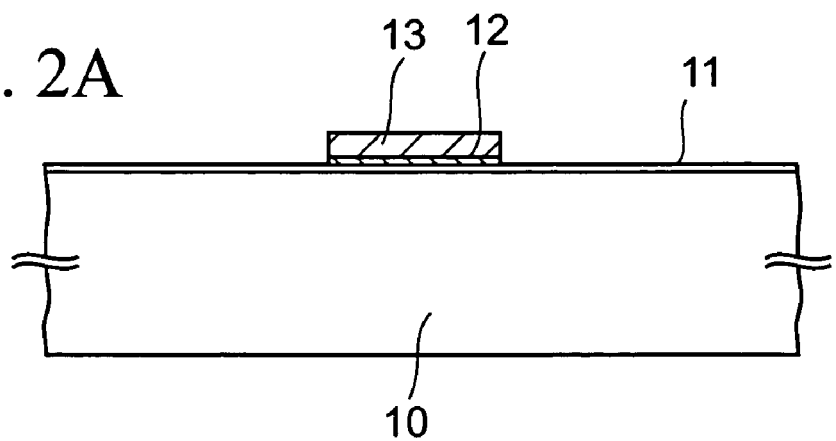
FIGS. 2A to 2D are sectional views showing a capacitive element according to a first embodiment of the present invention in the manufacturing process.

First, steps required until a sectional structure shown in FIG. 2A is obtained will be explained hereunder.

A thermal oxide film of about 1000 nm thickness is formed by thermally oxidizing a surface of a base member 10 such as a silicon (semiconductor) substrate, or the like, and the thermal oxide film is made into an underlying insulating film 11. Here, as the material constituting the base member 10, a germanium single crystal, a silicon germanium (SiGe), or the like may be employed in place of the silicon single crystal. Also, the base member 10 may be formed of the group III-V compound semiconductor that is made of any one of gallium arsenide (Gasp), indium arsenide (InAs), and indium phosphide (InP).

In addition, the underlying insulating film 11 is not limited to the thermal oxide film. A single layer film formed of any one of a silicon oxide film, a silicon nitride film, an insulating metal oxide film, and a xerogel film, or a laminated film formed of any combination of these films may be employed as the underlying insulating film 11. Also, if the base member 10 is formed of an insulating base member such as magnesium oxide, alumina, glass, or the like, the underlying insulating film 11 may be omitted.

Then, a titanium oxide ($TiO_2$) film of about 50 nm thickness is formed on an entire surface as an adhesive film 12 by the sputtering method. The adhesive film 12 is not limited to the titanium oxide film. A single layer film formed of any one of a gold film, an iridium film, a zirconium film, a titanium film, a titanium oxide ($TiO_x$) film, an iridium oxide ($IrO_x$) film, a platinum oxide ($PtO_x$) film, a zirconium oxide ($ZrO_x$) film, a titanium nitride (TiN) film, a titanium aluminum nitride (TiAlN) film, a tantalum nitride (TaN) film, and a tantalum silicon nitride (TaSiN) film, or a laminated film formed of any combination of these films may be employed as the adhesive film 12.

Then, a platinum film of about 80 nm thickness is formed on the adhesive film 12 by the sputtering method, and the platinum film is made into a lower electrode 13. Here, instead of the platinum, the lower electrode 13 may be formed of any one of gold, palladium, iridium, ruthenium, rhodium, rhenium, osmium, copper, platinum oxide ($PtO_x$), iridium oxide ($IrO_x$), and ruthenium oxide ($RuO_x$).

Then, the adhesive film 12 and the lower electrode 13 are patterned by the ion milling using an argon gas, and making their planar shapes into a rectangular shape.

Figure 2B:
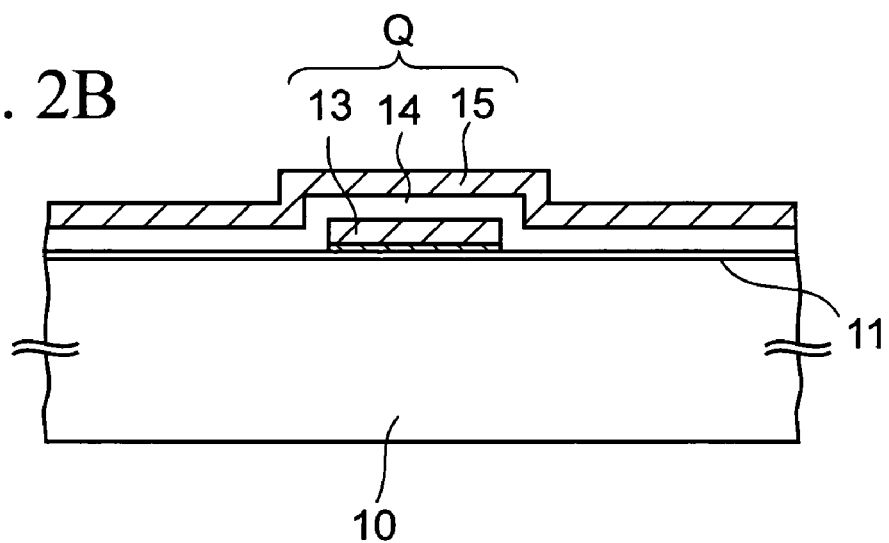

Then, as shown in FIG. 2B, a high-dielectric film made of $Ba_{0.7}Sr_{0.3}TiO_3$ (BST), or the like and having a thickness of about 100 nm is formed on the underlying insulating film 11 and on the lower electrode 13 by the RF magnetron sputtering method, and making the high-dielectric film into a capacitor dielectric film 14. The method of forming this capacitor dielectric film 14 is not particularly limited. The sol-gel method or the MOCVD (Metal Organic Chemical Vapor Deposition) method may be employed in place of the sputtering method.

In addition, the material of the capacitor dielectric film 14 is not particularly limited. The capacitor dielectric film 14 may be formed of any material of perovskite-type dielectric material, dielectric material having a pyrochlore structure, layered bismuth dielectric material, and tungsten bronze type dielectric material.

Examples of the perovskite-type dielectric material include, barium titanate, strontium titanate, BST (Barium Strontium Titanate), PZT (Lead Zirconate Titanate), PLZT (Lead Lanthanum Zirconate Titanate), bismuth titanate, and potassium tantalum oxide.

Also, examples of the layered bismuth dielectric material includes SBT (Strontium Bismuth Tantalate), SBN (Strontium Bismuth Niobate), SBTN (Strontium Bismuth Tantalate Niobate), PMN (Lead Magnesium Niobate), and layered bismuth titanate.

Furthermore, examples of the tungsten bronze type dielectric material include tungsten bronze type niobate, tungsten bronze type tantalate, and tungsten bronze type titanate.

In addition, the capacitor dielectric film 14 may be formed of any one of magnesium-based material, copper-based material, and tantalum oxide in place of these materials.

Thereafter, a noble metal film, e.g., a platinum film, of about 80 nm thickness is formed on the capacitor dielectric film 14 by the DC sputtering method, and making the noble metal film into an upper electrode 15. In this case, as the noble metal film available for the upper electrode 15, in addition to the platinum film, there are gold film, silver film, copper film, palladium film, iridium film, ruthenium film, and rhodium film. Also, the upper electrode 15 may be formed of any one of rhenium, platinum oxide ($PtO_x$), iridium oxide ($IrO_x$), and ruthenium oxide ($RuO_x$).

Up to these steps, a basic structure of a capacitor Q consisting of the lower electrode 13, the capacitor dielectric film 14, and the upper electrode 15 is completed.

The capacitor dielectric film 14 constituting the capacitor Q is easily reduced when it is exposed to the hydrogen or the moisture, and thus its ferroelectric characteristic or its high-dielectric characteristic is deteriorated. For this reason, a protection film for protecting the capacitor Q from such atmosphere is needed.

Figure 2C:
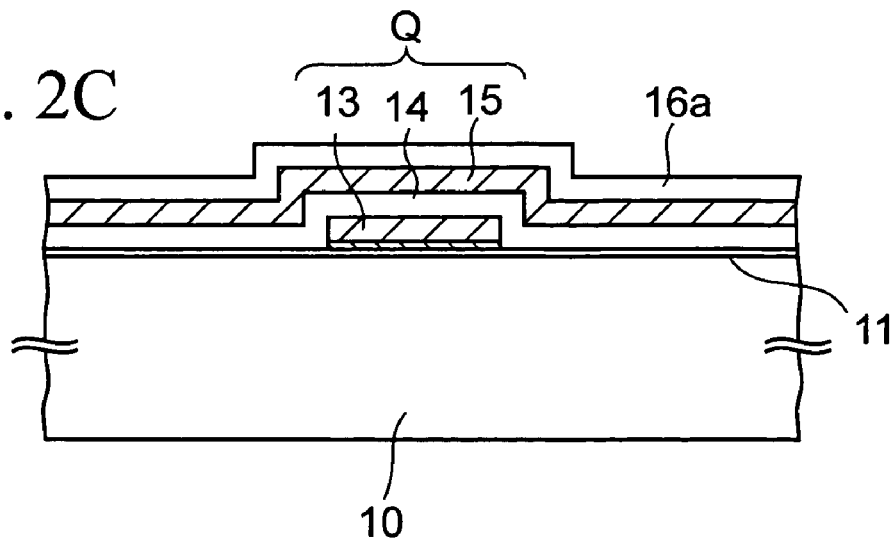

Therefore, in the next step shown in FIG. 2C, as a lower protection insulating film 16a constituting a lower portion of the protection film, a film having a narrow energy band gap Eg, e.g., a $Ba_{0.7}Sr_{0.3}TiO_3$ film (BST film) having the energy band gap Eg of 3.2 eV is formed by the RF sputtering method to have a thickness of equal to or more than 1 nm and equal to or less than 1000 nm, e.g., about 20 nm. The energy band gap Eg of the lower protection insulating film 16a is not particularly limited, but its energy band gap Eg is preferably more than or equal to 2.5 eV and less than or equal to 5.5 eV. As such insulating film, there is a PZT film other than the BST film.

Figure 2D:
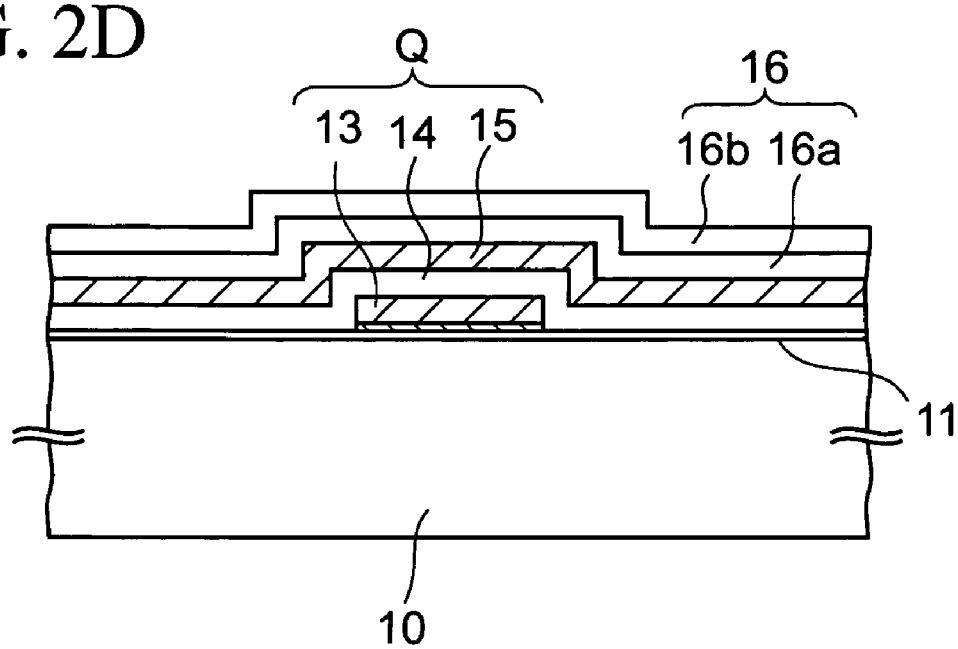

Then, as shown in FIG. 2D, as an upper protection insulating film 16b, a film having the energy band gap Eg that is wider than that of the lower protection insulating film 16a, e.g., an alumina ($Al_2O_3$) film having the energy band gap Eg of 10 eV is formed on the lower protection insulating film 16a by the sputtering method. Thus, the lower protection insulating film 16a and the upper protection insulating film 16b constitute a protection insulating film 16. A thickness of the upper protection insulating film 16b is not particularly limited, but preferably such upper protection insulating film 16b should be formed to have a thickness that is equal to or more than a thickness of the lower protection insulating film 16a within a range of equal to or more than 1 nm and equal to or less than 1000 nm, e.g., a thickness of 50 nm.

Also, the energy band gap Eg of the upper protection insulating film 16b is not particularly limited if such gap is wider than that of the lower protection insulating film 16a, but preferably such energy band gap Eg is more than or equal to 5.5 eV and less than or equal to 11 eV. As the insulating film having the energy band gap Eg of such value, there are a silicon nitride ($Si_3N_4$) film and a silicon oxide ($SiO_2$: Eg=9 eV) film other than the alumina film.

Up to these steps, a basic structure of the capacitive element according to the present embodiment is completed.

In this capacitive element, the protection insulating film 16 for protecting the capacitor Q from the harmful atmosphere containing the hydrogen or the moisture is formed to have a double-layered structure consisting of the lower protection insulating film 16a having the narrow energy band gap Eg and the upper protection insulating film 16b having the energy band gap Eg that is wider than that of the lower protection film 16a. According to this structure, an adhesive strength between the protection insulating film 16 and the upper electrode 15 is dominated by the lower protection insulating film 16a. Although various factors may be considered as the factor of deciding an intensity of the adhesive strength, the inventor of this application considers such factors as follows.

Figure 3:
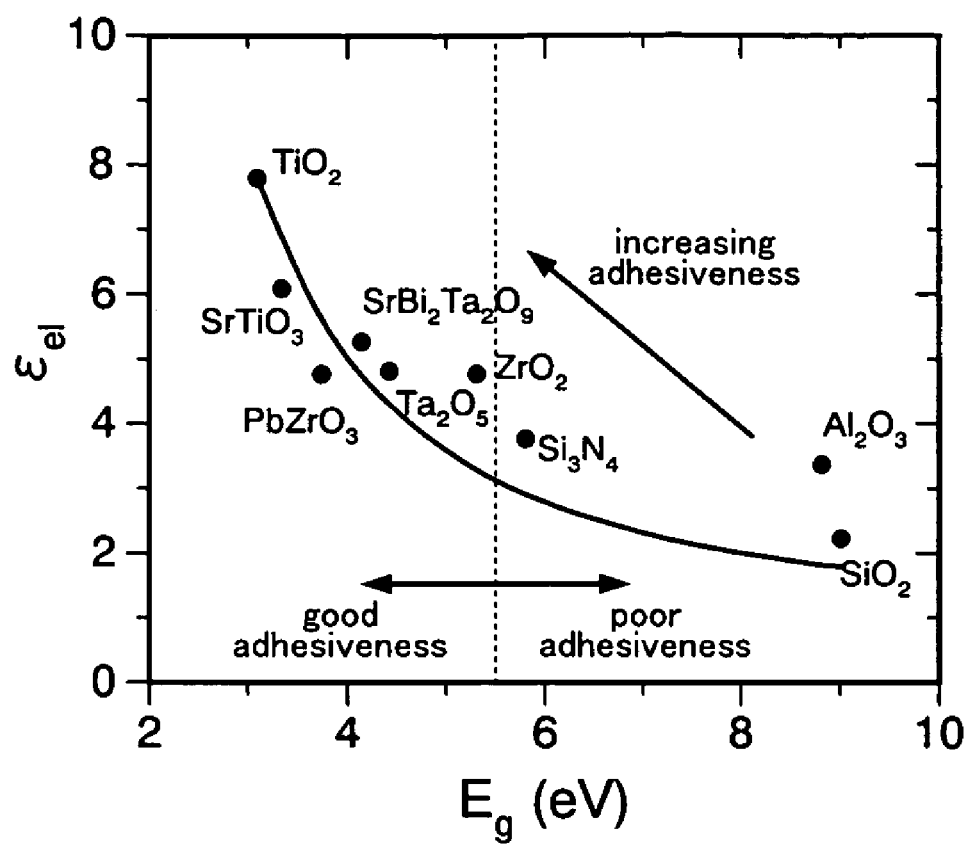
FIG. 3 is a view derived after a relationship between an energy band gap and a dielectric constant was examined on various insulating materials respectively.

FIG. 3 shows a relationship between the energy band gap Eg and an optical dielectric constant $\in_{el}$ of various insulating materials. As shown in FIG. 3, the dielectric constant $\in_{el}$ is increased as the energy band gap Eg becomes narrower. For example, the insulating material with the wide energy band gap Eg such as $Al_2O_3$, $SiO_2$, or the like has the smaller dielectric constant $\in_{el}$ than the material with the narrow energy band gap Eg such as $SrTiO_3$, $TiO_3$, or the like. This can be understood from the following Equation (1) using an average value <Eg> of the energy band gap, which is defined in "Semiconductor Surfaces and Interfaces", edit. W. Monch, Springer-Verlag, Berlin Heidelberg, 1993, pp 35:

$$\in_{el}-1=(\eta\omega_p/<E_g>)^2 \quad (1)$$

where $\in_{el}$: dielectric constant, $\hbar\omega_p$: energy of a plasmon of an electron in the valence band.

Eq. (1) shows that if the average value <Eg> of the energy band gap becomes narrower, the dielectric constant is increased. Density functional theory using a semi-infinite jellium in contact with a insulator (D. Dahl and J. W. Halley, J. Chem. Phys. 77, 1661 (1982)) as well as calculations based on a dielectric formalism using the concepts of collective excitations (A. N. Vakilov, M. V. Mamonova, and V. V. Prudnicov, Phys. Solid State 39, 864 (1997)) show that the adhesion strength of a non-reactive metal and a insulator increase with increasing dielectric constant. In density functional theory this is due to the spreading of the electronic charge distribution from the metal into the insulator. A penetration depth of the electron distribution from the metal to the insulator is increased when the dielectric constant is large. Then, when the penetration depth is increased, the electrons serving as binding arms of the bond between the metal and the insulator enter deeply into the insulator and thus the adhesive strength between them is increased. As a result, as shown in FIG. 3, the adhesive strength between the metal and the insulator is enhanced when the energy band Eg of the insulator decreases and thus its dielectric constant increases.

Also, it is understood from the results shown in FIG. 3 that the lower protection insulating film 16a may be formed of any one of $TiO_2$, $SrTiO_3$, $SrBi_2Ta_2O_9$, $PbZrO_3$, $Ta_2O_5$, and $ZrO_2$.

According to the experiment made by the inventors of this application, the insulator having the energy band gap Eg of 5.5 eV or less exhibited the excellent adhesive strength to the noble metal whereas the insulator having the energy band gap Eg of more than 5.5 eV caused a fault in the adhesiveness to the noble metal.

In this manner, in the present embodiment, since the protection insulating film 16 is constructed by the upper protection insulating film 16b (see FIG. 2D) and the lower protection insulating film 16a having the energy band gap that is smaller than that of the upper protection insulating film 16b, the peeling of the protection insulating film 16 is effectively suppressed. Therefore, capacitor dielectric film 14 can be prevented from being exposed to the harmful atmosphere containing the hydrogen or the moisture, and hence it is possible to satisfactorily maintain the characteristics of the capacitor Q in the manufacturing steps and under the actual use.

In particular, like the present embodiment, in the case where the upper electrode 15 is formed of the noble metal such as platinum, or the like, if the film having the wide energy band gap is employed as the lower protection insulating film 16a, it is likely that the adhesive strength between the upper electrode 15 and the lower protection insulating film 16a is lowered because the noble metal has a weak reactivity with other elements. In contrast, in the present embodiment, the lower protection insulating film 16a is formed of the material such as BST, or the like, which has the narrower energy band gap than that of the upper protection insulating film 16b. Therefore, the electrons in the upper electrode 15 are ready to enter into the lower protection insulating film 16a, and thus the adhesive strength between the upper electrode 15 and the protection insulating film 16 can be sufficiently enhanced by such electrons.

In addition, the upper protection insulating film 16b having the wide energy band gap Eg and the high barrier characteristic against the hydrogen or the moisture is formed on the lower protection insulating film 16a. Therefore, the capacitor Q can be protected from the harmful atmosphere assuredly.

(3) Second Embodiment

FIGS. 4A to 4D are sectional views showing a capacitive element according to a second embodiment of the present invention in the manufacturing process.

This capacitive element is a decoupling capacitor that is packaged on the wiring substrate together with the semiconductor device such as LSI, or the like to absorb the voltage fluctuation, and the like on the power-supply line in LSI.

Figure 4A:
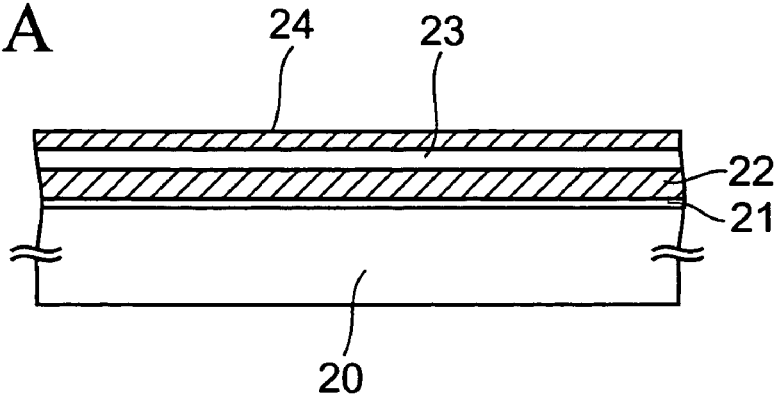
FIGS. 4A to 4D are sectional views showing a capacitive element according to a second embodiment of the present invention in the manufacturing process.

At first, steps required until a sectional structure shown in FIG. 4A is obtained will be explained hereunder.

First, a silicon oxide ($SiO_2$) film of about 500 nm thickness is formed on a base member 20 such as a silicon substrate, or the like by the CVD (Chemical Vapor Deposition) method using a silane as a reaction gas. This film is used as an underlying insulating film 21.

Then, as a lower electrode 22, a platinum film of about 80 nm thickness is formed on the underlying insulating film 21 by the sputtering method.

In addition, a high-dielectric film made of $Ba_{0.7}Sr_{0.3}TiO_3$ (BST), or the like and having a thickness of about 80 nm is formed on the lower electrode 22 by the RF magnetron sputtering method. This film is used as a dielectric film 23.

Then, as a conductive film 24, a platinum film of about 80 nm thickness is formed on the dielectric film 23 by the DC sputtering method.

Figure 4B:
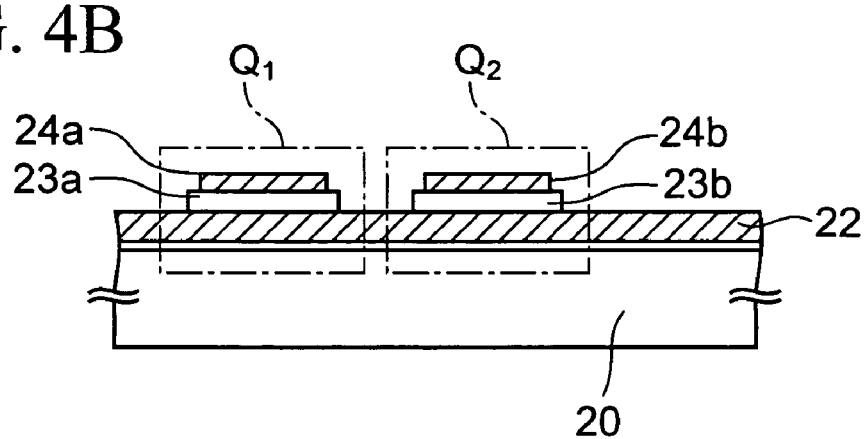

Then, as shown in FIG. 4B, first and second upper electrodes 24a, 24b are formed like an island respectively by patterning the conductive film 24 by means of the photolithography. Then, first and second capacitor dielectric films 23a, 23b are formed under the upper electrodes 24a, 24b respectively by patterning the dielectric film 23 by means of the photolithography. As a result, two capacitors $Q_1$, $Q_2$ consisting of the lower electrode 22, the first and second capacitor dielectric films 23a, 23b, and the first and second upper electrodes 24a, 24b respectively are formed on the substrate 20.

Figure 4C:
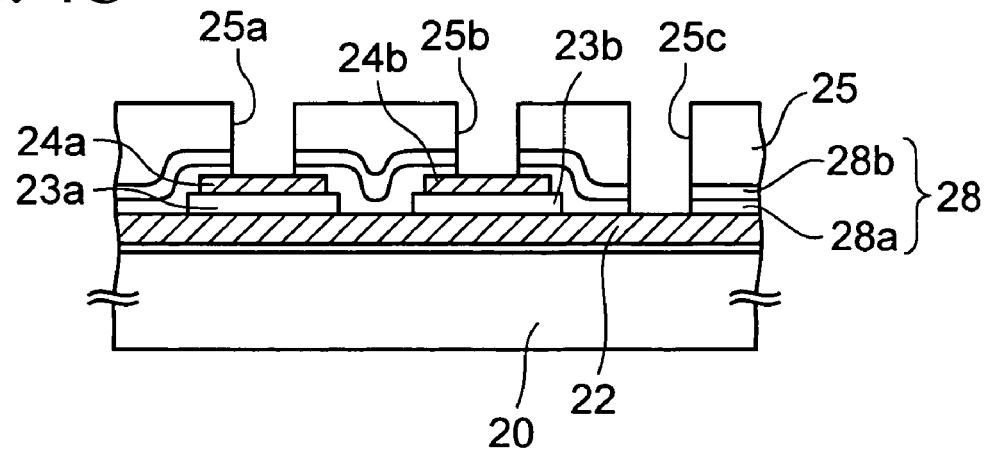

Then, as shown in FIG. 4C, in order to protect the capacitors $Q_1$, $Q_2$ from the atmosphere containing the hydrogen or the moisture, a BST film whose energy band gap Eg is narrow such as 3.2 eV and whose thickness is about 20 nm is formed on the upper electrodes 24a, 24b and the lower electrode 22 respectively. This film is used as a lower protection insulating film 28a.

In addition, a film having the wider energy band gap Eg than the lower protection insulating film 28a, e.g., an alumina film (Eg=10 eV), is formed on the lower protection insulating film 28a by the sputtering method to have a thickness of about 50 nm. This film is used as an upper protection insulating film 28b.

Accordingly, a protection insulating film 28 having a double-layered structure consisting of the insulating film 28a, 28b is formed to cover the capacitors $Q_1$, $Q_2$. As explained in the first embodiment, the lower protection insulating film 28a constituting the protection insulating film 28 can have the enhanced adhesive strength to the lower electrode 22 and the upper electrodes 24a, 24b because its energy band gap Eg is narrower than the upper protection insulating film 28b. In addition, since the upper protection insulating film 28b is formed of the material whose energy band gap Eg is wider than the lower protection insulating film 28a and whose barrier characteristic is excellent, the capacitors $Q_1$, $Q_2$ can be protected without fail from the atmosphere containing the hydrogen or the moisture that causes the capacitor dielectric films 23a, 23b to deteriorate.

Then, an insulating resin made of polyimide, or the like is coated on a whole surface by the spin coating and then is thermally cured, and thus a resin film 25 of about 100 nm thickness is formed. Then, first and second holes 25a, 25b having depths that reach the upper electrodes 24a, 24b respectively are formed by patterning the resin film 25 and the protection insulating film 28 by means of the photolithography. Also, a third hole 25c having a depth that reaches the lower electrode 22 located in the portion in which the upper electrodes 24a, 24b are not formed is formed.

A part of the protection insulating film 28 is removed from upper surfaces of the first and second upper electrodes 24a, 24b because such first and second holes 25a, 25b are formed in this manner, nevertheless the barrier characteristic of the protection insulating film 28 can be assured adequately.

Figure 4D:
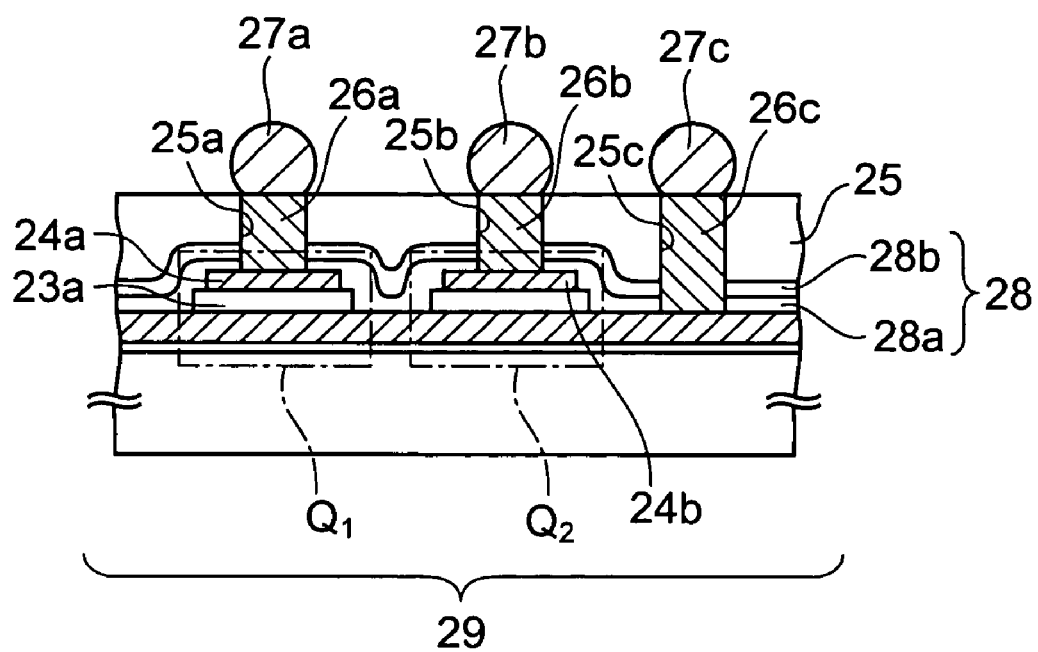

Then, as shown in FIG. 4D, a Ti film, a Cu film, and an Ni film, for example, are buried in respective holes 25a to 25c in this order. Thus, first and second conductive plugs 26a, 26b connected electrically to the upper electrodes 24a, 24b respectively are formed in the first and second holes 25a, 25b, and also a third conductive plug 26c connected electrically to the lower electrode 22 is formed in the third hole 25c. For example, the Ti film constituting the first to third conductive plugs 26a to 26c is formed by the sputter, and the Cu film and the Ni film are formed by the electroplating.

Then, first to third solder bumps 27a to 27c acting as external connection terminals are mounted on upper surfaces of the conductive plugs 26a to 26c. These solder bumps 27a to 27c are melted in the reflow atmosphere, and then are connected electrically and mechanically to the conductive plugs 26a to 26c.

With the above, a basic structure of a capacitive element 29 according to the present embodiment is completed.

The applicable use of the capacitive element 29 is not particularly limited. For example, as shown in FIG. 5, it is preferable that the capacitors $Q_1$, $Q_2$ should be used as the decoupling capacitor that is packaged into a wiring substrate 32 together with a semiconductor element 30 to absorb the switching noise in the semiconductor element 30 or the voltage fluctuation on the power-supply line.

Figure 5:
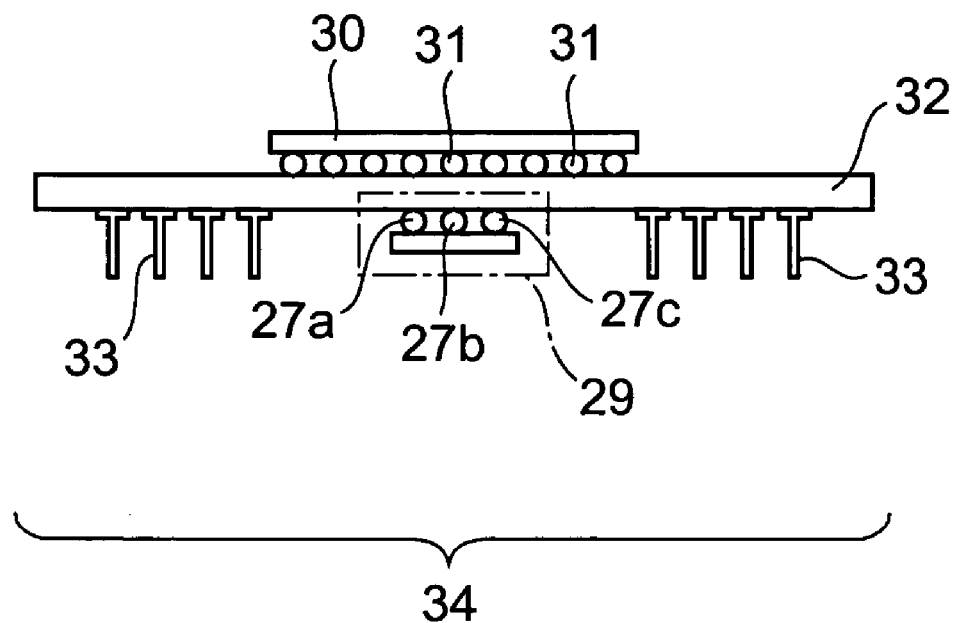
FIG. 5 is a sectional view showing the case where a capacitive element is used as a decoupling capacitor, in the second embodiment of the present invention.

In the example in FIG. 5, the capacitive element 29 and the wiring substrate 32 are connected electrically and mechanically mutually via the first to third solder bumps 27a to 27c constituting the capacitive element 29. Similarly, the semiconductor element 30 is connected electrically and mechanically to the wiring substrate 32 via solder bumps 31. Then, a semiconductor package 34 is constructed by the capacitive element 29, the wiring substrate 32, and the semiconductor element 30, and also a plurality of conductive pins 33 serving as external connection terminals of the semiconductor package 34 are provided upright.

Figure 6:
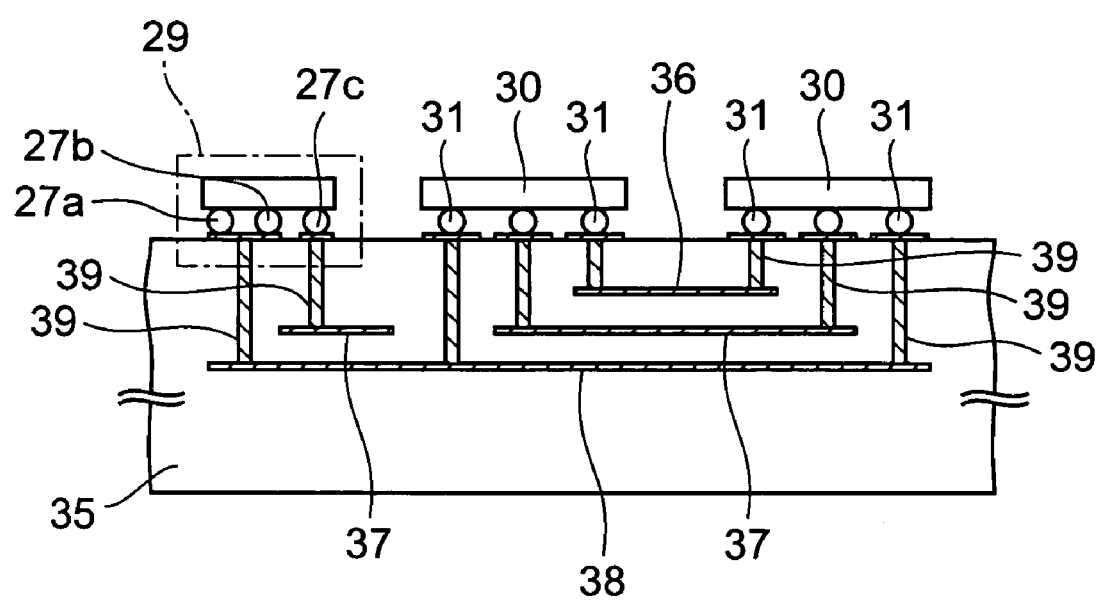
FIG. 6 is a sectional view showing the case where a capacitive element is packaged in an MCM and used as a decoupling capacitor, in the second embodiment of the present invention.

Also, the capacitive element 29 may be packaged in an MCM (multi-chip module) shown in FIG. 6, and the capacitors $Q_1$, $Q_2$ may be used as the decoupling capacitor for the semiconductor element 30. In the example shown in FIG. 6, a signal conductive layer 36, a power-supply conductive layer 37, and a ground conductive layer 38 are formed on a ceramic substrate 35. Then, two semiconductor elements 30 are packaged in the ceramic substrate 35, and then the semiconductor elements 30 and the conductive layers 36 to 38 are connected electrically mutually via conductive plugs 39.

In addition, the foregoing capacitive element 29 is packaged on the ceramic substrate 35 beside the semiconductor element 30, and the semiconductor elements 30 are connected electrically to the capacitive element 29 via the conductive plugs 39 of the power-supply conductive layer 37 and the ground conductive layer 38 respectively.

In such example, the voltage fluctuation between the power-supply conductive layer 37 and the ground conductive layer 38 can be absorbed by the capacitive element 29. Thus, a malfunction of the semiconductor element 30 caused due to the fluctuation of the power supply voltage can be prevented.

According to the present embodiment explained as above, as shown in FIG. 4D, the double-layered structure consisting of the lower protection insulating film 28a having the narrow energy band gap Eg and the upper protection insulating film 28b having the wider energy band gap Eg than that of the insulating film 28a is employed as the protection insulating film 28 that protects the capacitors $Q_1$, $Q_2$.

Therefore, while enhancing the adhesiveness of the protection insulating film 28 by using the lower protection insulating film 28a having the narrow energy band gap, the barrier characteristic can be assured sufficiently by the upper protection insulating film 28b having the wide energy band gap. As a result, both the adhesiveness and the barrier characteristic can be achieved at the same time.

(4) Third Embodiment

The protection insulating film having the double-layered structure explained in the first embodiment can be applied preferably to the semiconductor device such as FeRAM (Ferroelectric Random Access Memory), DRAM (Dynamic Random Access Memory), or the like, in which the capacitor into which the information are written is formed.

Therefore, in the present embodiment, the case where the protection insulating film having the double-layered structure is applied to FeRAM will be explained hereunder.

FIGS. 7A to 7L are sectional views showing a semiconductor device according to a third embodiment of the present invention in the manufacturing process. By way of example, explanation will be made hereunder of the stack type FeRAM in which the conductive plug is formed just under the ferroelectric capacitor. But the present invention is not limited to this application, and the present invention can also be applied to the planar type FeRAM.

Figure 7A:
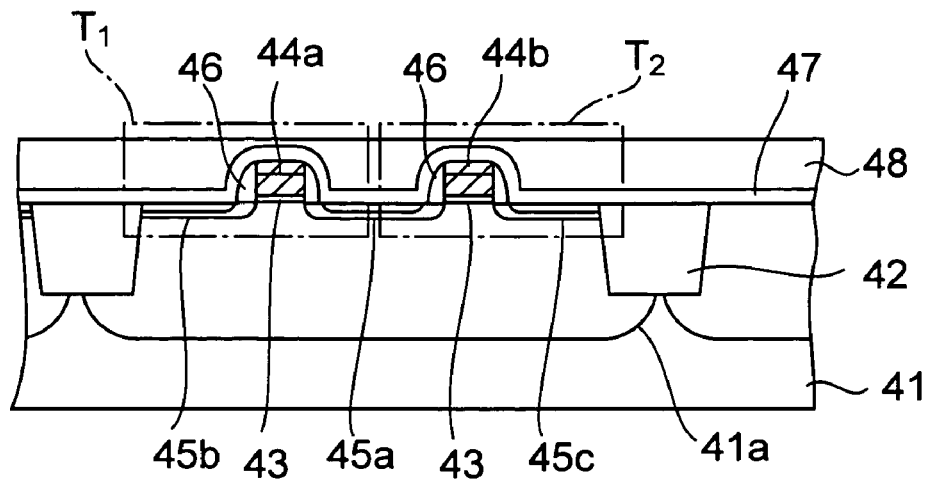
FIGS. 7A to 7L are sectional views showing a semiconductor device according to a third embodiment of the present invention in the manufacturing process.

First, steps required until a sectional structure shown in FIG. 7A is obtained will be explained hereunder.

At first, an element isolation trench is formed around a transistor forming region of an n-type or p-type silicon substrate 41 by the photolithography, and then a silicon oxide is buried in the element isolation trench. Thus, an element isolation insulating film 42 is formed. The element isolation insulating film 42 having such structure is called STI (Shallow Trench Isolation). In this case, an insulating film formed by the LOCOS (Local Oxidation of Silicon) method may be employed as the element isolation insulating film.

Then, a p-well 41a is formed by introducing the p-type impurity into the transistor forming region of the silicon substrate 41. Then, a silicon oxide film used as a gate insulating film 43 is formed by thermally oxidizing a surface of the transistor forming region of the silicon substrate 41.

Then, an amorphous silicon or polysilicon film and a tungsten silicide film are formed in seriatim on an upper whole surface of the silicon substrate 41. Then, gate electrodes 44a, 44b are formed by patterning this silicon film and the tungsten silicide film by means of the photolithography.

Here, two gate electrodes 44a, 44b are formed in parallel on one p-well 41a, and these gate electrodes 44a, 44b constitute a part of the word line.

Then, the n-type impurity is ion-implanted into the p-well 41a on both sides of the gate electrodes 44a, 44b. Thus, first to third n-type impurity diffusion regions 45a to 45c serving as the source/drain regions are formed.

Then, an insulating film, e.g., a silicon oxide film, is formed on an entire surface of the silicon substrate 41 by the CVD method. Then, an insulating sidewall spacer 46 is left on both side portions of the gate electrodes 44a, 44b respectively by etching back the insulating film.

Then, the n-type impurity is ion-implanted again into the first to third n-type impurity diffusion regions 45a to 45c, while using the gate electrodes 44a, 44b and the sidewall spacers 46 as a mask. Thus, the first to third n-type impurity diffusion regions 45a to 45c are shaped into an LDD (Lightly Doped Drain) structure.

In this case, the first n-type impurity diffusion region 45a located between two gate electrodes 44a, 44b in one transistor forming region is connected electrically to the bit line. Also, the second and third n-type impurity diffusion regions 45b, 45c located on both end sides of the transistor forming region are connected electrically to the lower electrode of the capacitor.

With the above steps, two MOS transistor $T_1$, $T_2$ having the gate electrodes 44a, 44b and the n-type impurity diffusion regions 45a to 45c each having the LDD structure are formed on the p-well 41a.

Then, as a cover insulating film 47 for covering the MOS transistor $T_1$, $T_2$, a silicon oxide nitride (SiON) film of about 200 nm thickness is formed on a whole surface of the silicon substrate 41 by the plasma CVD method. Then, as a first interlayer insulating film 48, a silicon oxide film of about 1.0 μm thickness is formed on the cover insulating film 47 by the plasma CVD method using a TEOS gas. Then, an upper surface of the first interlayer insulating film 48 is planarized by the CMP (Chemical Mechanical Polishing) method.

Figure 7B:
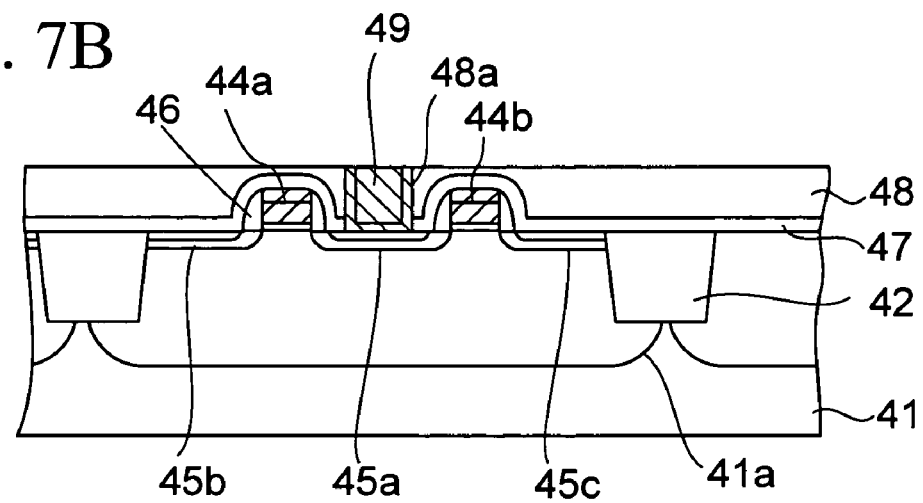

Next, steps required until a sectional structure shown in FIG. 7B is obtained will be explained hereunder.

First, the cover insulating film 47 and the first interlayer insulating film 48 are patterned by the photolithography. Thus, a first contact hole 48a having a depth that reaches the first n-type impurity diffusion region 45a is formed. Then, a titanium (Ti) film of 30 nm thickness and a titanium nitride (TiN) film of 50 nm thickness are formed sequentially as a glue film on an upper surface of the first interlayer insulating film 48 and an inner surface of the contact hole 48a by the sputtering method. Then, a tungsten (W) film is grown on the TiN film by the CVD method using $WF_6$ to bury completely the inside of the first contact hole 48a.

Then, the W film, the TiN film, and the Ti film are removed from the upper surface of the first interlayer insulating film 48 by polishing them by virtue of the CMP method. The tungsten film, the TiN film, and the Ti film left in the first contact hole 48a are used as a first conductive plug 49.

Figure 7C:
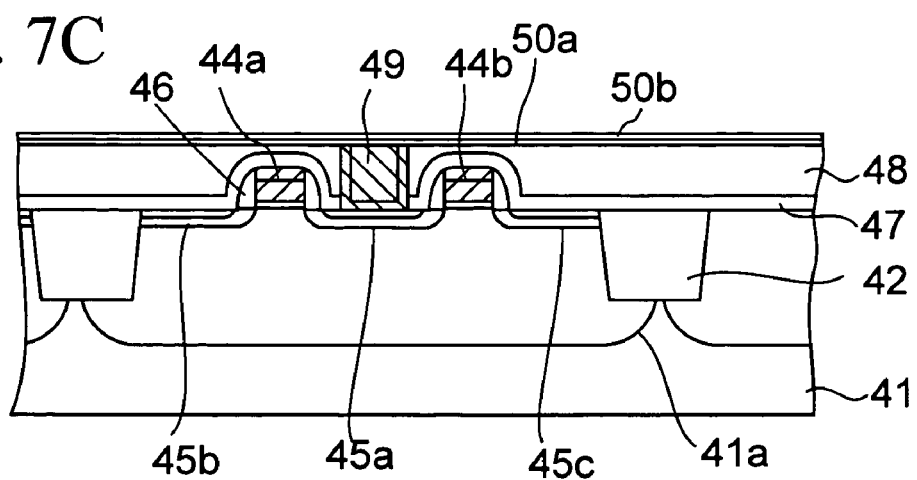

Then, as shown in FIG. 7C, an oxidation preventing insulating film 50a, which is made of silicon nitride ($Si_3N_4$) and has a thickness of 100 nm, and an underlying insulating film 50b, which is made of silicon oxide ($SiO_2$) and has a thickness of 100 nm, are formed sequentially on the first interlayer insulating film 48 and the first conductive plug 49 by the plasma CVD method. The silicon oxide film is grown by the plasma CVD method using TEOS. Also, the oxidation preventing insulating film 50a is formed to prevent the contact failure that is caused by an abnormal oxidation of the first conductive plug 49 during the thermal treatment such as the later annealing, or the like. It is desirable that a film thickness of the oxidation preventing insulating film 50a be 70 nm or more, for example.

Figure 7D:
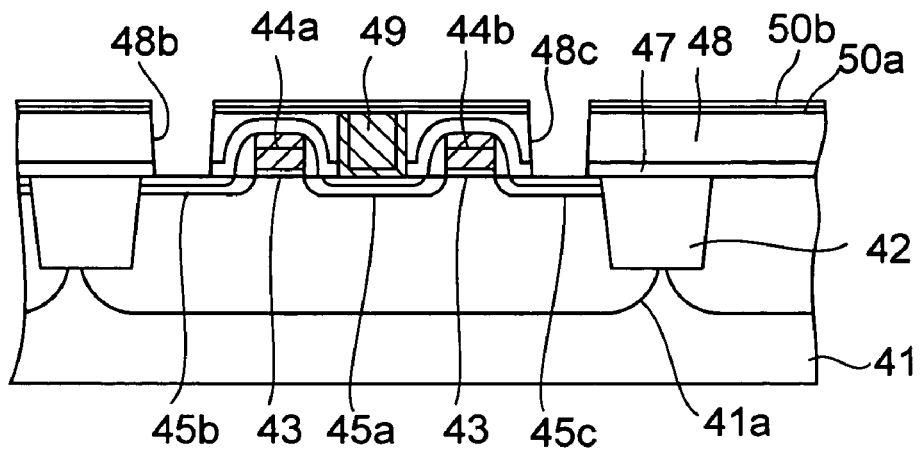

Then, as shown in FIG. 7D, the oxidation preventing insulating film 50a, the underlying insulating film 50b, and the first interlayer insulating film 48 are etched by using a resist pattern (not shown). Thus, second and third contact holes 48b, 48c are formed on the second and third n-type impurity diffusion regions 45b, 45c respectively.

In addition, a Ti film of 30 nm thickness and a TiN film of 50 nm thickness are formed sequentially as a glue film on an upper surface of the underlying insulating film 50b and inner surfaces of the second and third contact holes 48b, 48c by the sputtering method. Then, a W (tungsten) film is grown on the TiN film by the CVD method to bury completely the inside of the second and third contact holes 48b, 48c.

Figure 7E:
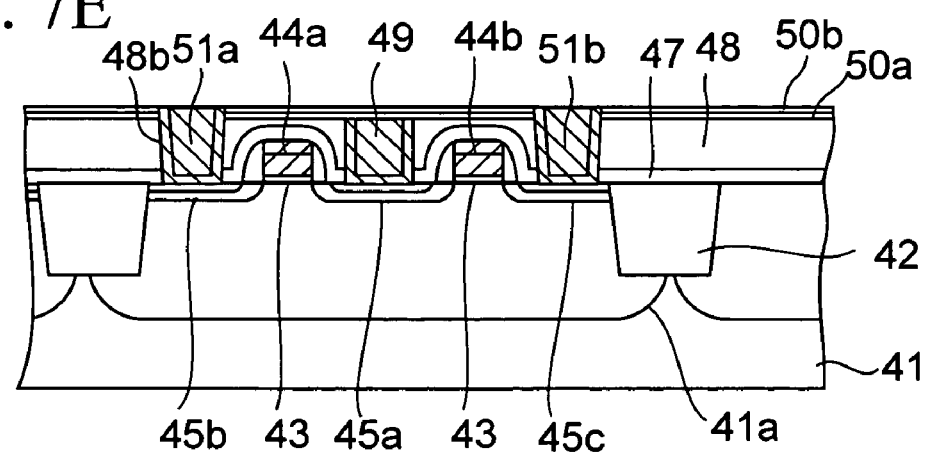

Then, as shown in FIG. 7E, the W film, the TiN film, and the Ti film are polished by the CMP method, and are removed from the upper surface of the underlying insulating film 50b. Thus, the W film, the TiN film, and the Ti film left in the second and third contact holes 48b, 48c are used as second and third conductive plugs 51a, 51b respectively.

Figure 7F:
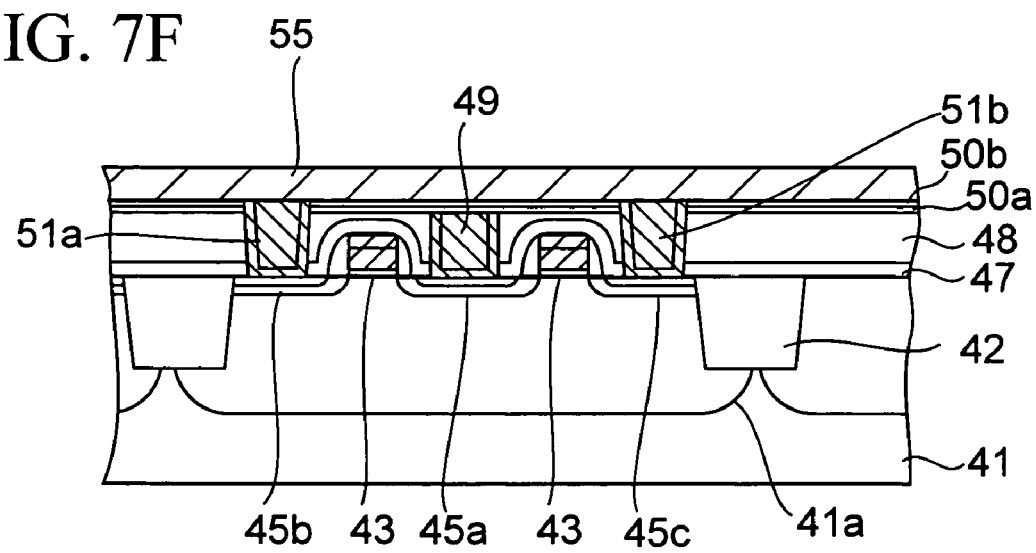

Then, as shown in FIG. 7F, an iridium film of about 150 nm thickness is formed on the second and third conductive plugs 51a, 51b and the underlying insulating film 50b by the DC sputtering method respectively. This film is used as a first conductive film 55.

In this case, the method of forming the first conductive film 55 is not limited to the sputtering method. The first conductive film 55 may be formed by the MOD method, the sol-gel method, or the CVD method.

Figure 7G:
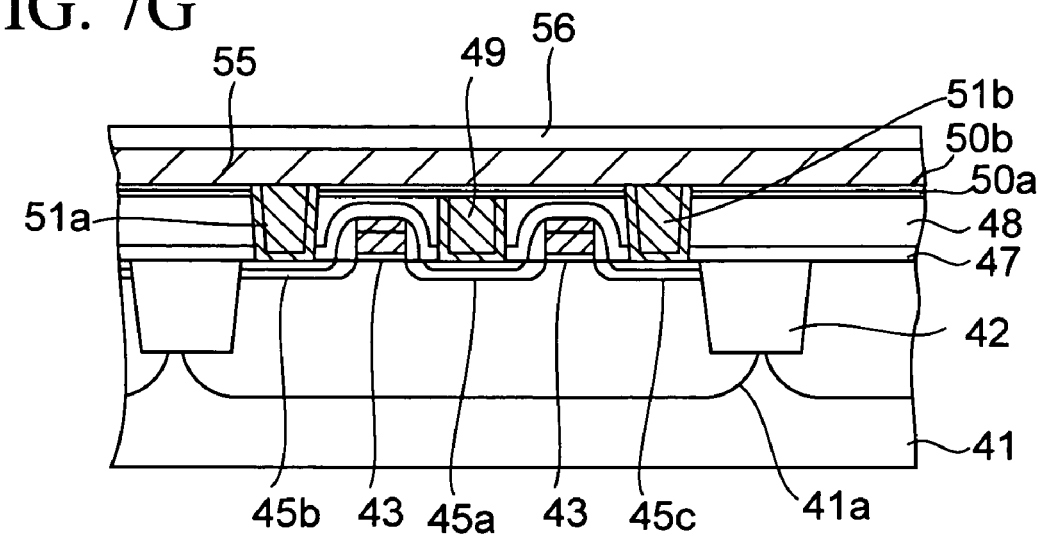

Then, as shown in FIG. 7G, a PZT film of 120 nm thickness is formed on the first conductive film 55 by the MOCVD method while setting a substrate temperature to 620° C., for example. This film is used as a ferroelectric film 56. In the MOCVD method, for example, $Pb(thd)_2(Pb(C_{11}H_{19}O_2)_2)$ dissolved in a THF (Tetrahydrofuran: $C_4H_8O$) solution is used as an organic source for supplying the lead, and $Zr(DMHD)_4(Zr(C_9H_{15}O_2)_4)$ dissolved in the THF solution is used as an organic source for supplying the zirconium. In addition, $Ti(O-iPr)_2(thd)_2(Ti(C_3H_7O)_2(C_{11}H_{19}O_2)_2)$ dissolved in the THF solution is used as an organic source for supplying the titanium.

Figure 7H:
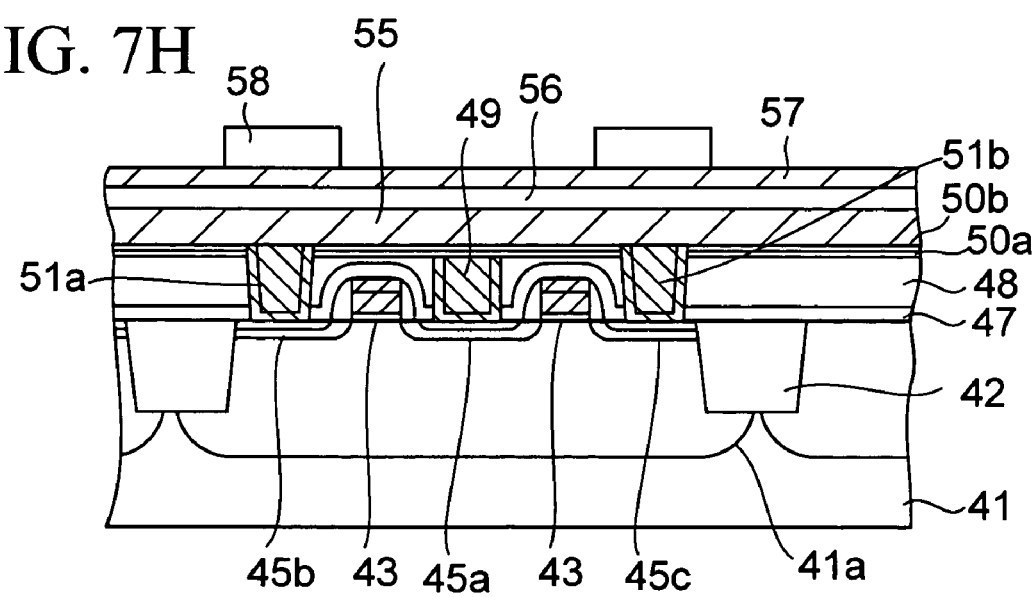

Next, steps required until a sectional structure shown in FIG. 7H is obtained will be explained hereunder.

First, as a second conductive film 57, a zirconium dioxide film of 200 nm thickness, for example, is formed on the ferroelectric film 56 by the sputtering method.

Then, as a hard mask 58, a TiN film and an $SiO_2$ film are formed sequentially on the second conductive film 57. Then, the hard mask 58 is patterned by the photolithography to form a capacitor planar shape over the second and third conductive plugs 51a, 51b.

Figure 7I:
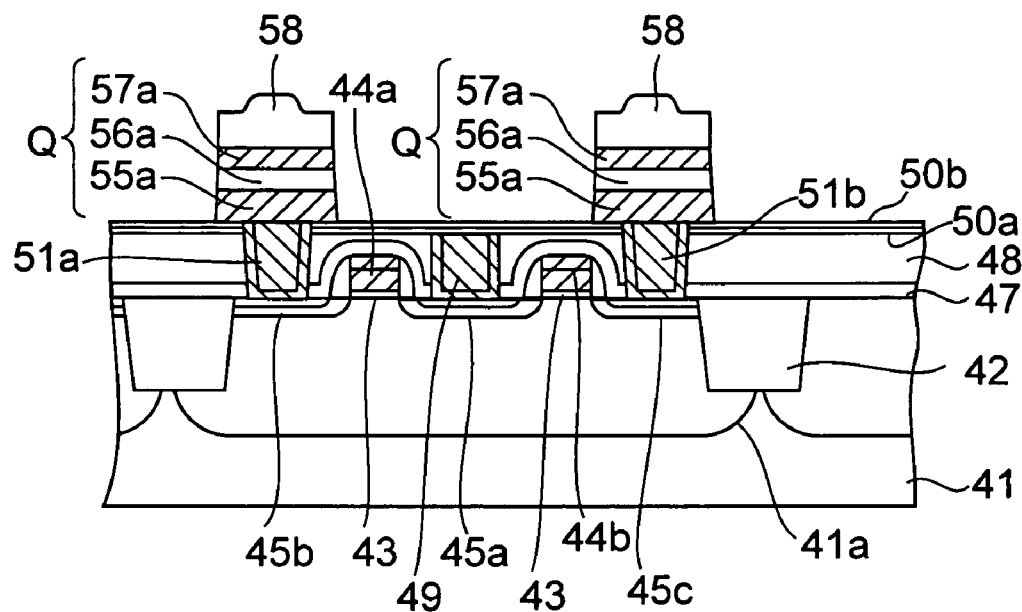

Then, as shown in FIG. 7I, the first conductive film 55, the ferroelectric film 56, and the second conductive film 57 located in the region that is not covered with the hard mask 58 are etched sequentially. In this case, the ferroelectric film 56 is etched by the sputter reaction in the atmosphere containing chlorine and an argon. Also, the first and second conductive films 55, 57 are etched by the sputter reaction in the atmosphere into which bromine ($Br_2$) is introduced.

With the above, a lower electrode 55a made of the first conductive film 55, a capacitor ferroelectric film 56a made of the ferroelectric film 56, and an upper electrode 57a made of the second conductive film 57 are formed on the underlying insulating film 50b. Accordingly, a ferroelectric capacitor Q is constructed by these elements.

Then, in the transistor forming region, one lower electrode 55a is connected electrically to the second n-type impurity diffusion region 45b via the second conductive plug 51a and also another lower electrode 55a is connected electrically to the third n-type impurity diffusion region 45c via the third conductive plug 51b.

Then, the hard mask 58 is removed.

Then, in order to recover the damage of the ferroelectric film 56 caused by the etching, a recovery annealing is carried out. The recovery annealing in this case is executed for 60 minute in the oxygen atmosphere at a substrate temperature of 550° C., for example.

Figure 7J:
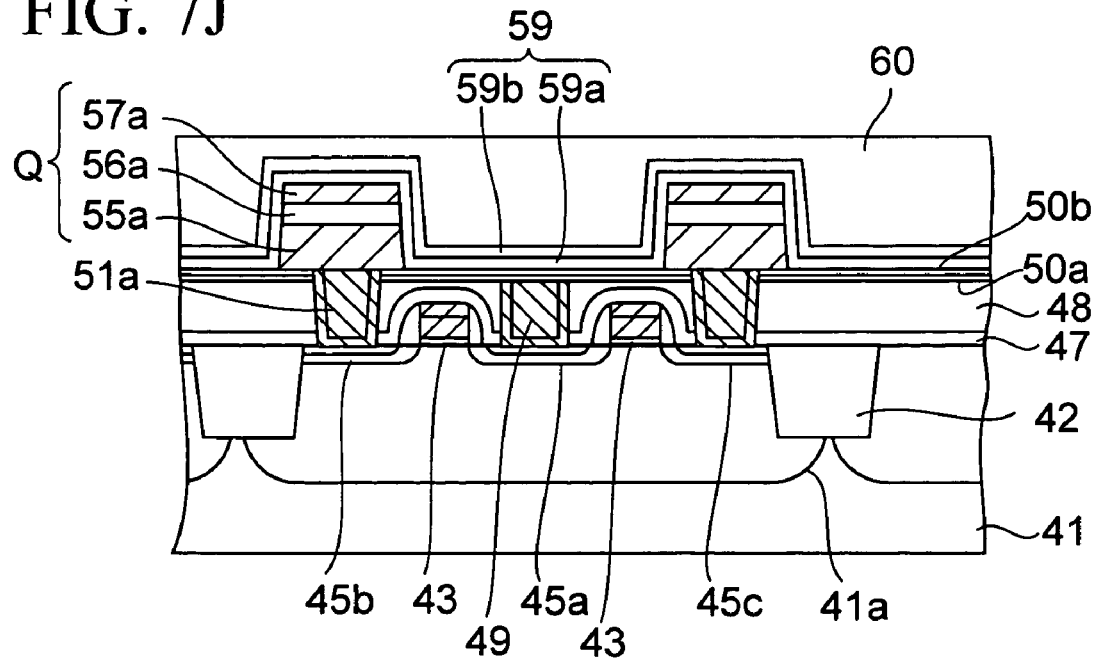

Then, as shown in FIG. 7J, as a lower protection insulating film 59a for covering the ferroelectric capacitor Q, the BST film whose energy band gap Eg is relatively narrow such as about 3.2 eV is formed on the underlying insulating film 50b and the upper electrode 57a by the sputtering method respectively to have a thickness of about 20 nm.

In addition, an insulating film whose energy band gap Eg is wider than the lower protection insulating film 59a, e.g., an alumina film having Eg of 10 eV, is formed on the lower protection insulating film 59a by the sputtering method to have a thickness of about 50 nm. This film is used as an upper protection insulating film 59b.

As a result, the ferroelectric capacitor Q is covered with a protection insulating film 59 having the double-layered structure that consists of the lower protection insulating film 59a and the upper protection insulating film 59b. Thus, the ferroelectric capacitor Q is protected from the atmosphere containing the hydrogen or the moisture that causes the capacitor ferroelectric film 56a to deteriorate in the manufacturing process or in actual use.

Then, as a second interlayer insulating film 60, a silicon oxide film of about 1.0 μm thickness is formed on the protection insulating film 59 by the plasma CVD method using the TEOS gas. Then, an upper surface of the second interlayer insulating film 60 is planarized by the CMP method. In this example, a remaining film thickness of the second interlayer insulating film 60 after the CMP is about 300 nm on the upper electrode 57a of the ferroelectric capacitor Q.

Figure 7K:
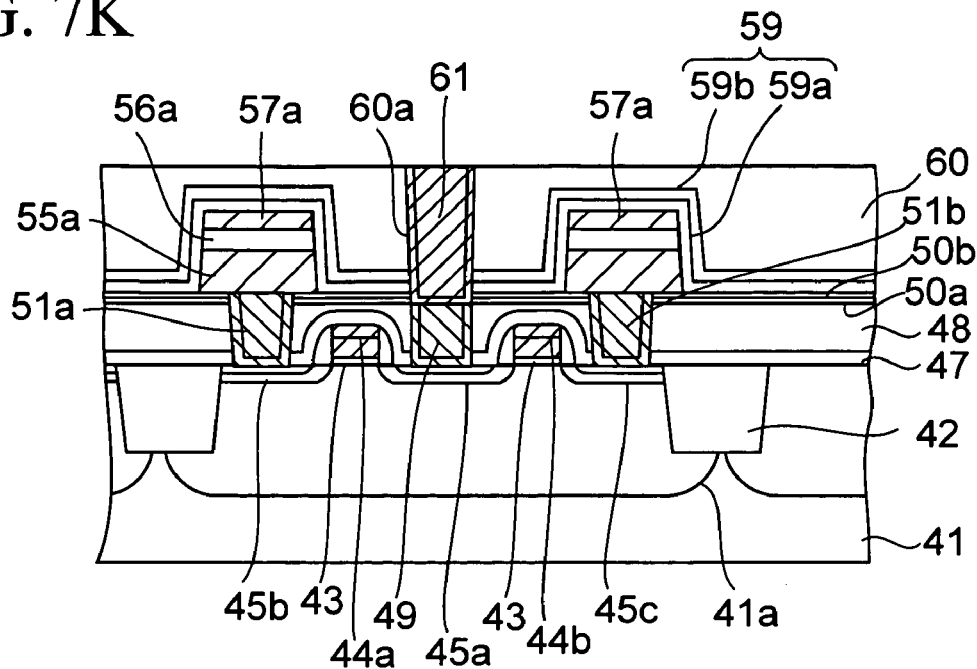

Then, as shown in FIG. 7K, the second interlayer insulating film 60, the protection insulating film 59, the oxidation preventing insulating film 50a, and the underlying insulating film 50b are etched by using a resist mask (not shown). Thus, a contact hole 60a is formed on the first conductive plug 49.

Then, a TiN film of 50 nm thickness is formed as a glue film in the contact hole 60a and on the second interlayer insulating film 60 by the sputtering method. In addition, a W film is grown on the glue film by the CVD method to fill completely the inside of the contact hole 60a.

Then, the W film and the TiN film are polished by the CMP method and are removed from the upper surface of the second interlayer insulating film 60. Thus, the W film and the TiN film left in the contact hole 60a are used as a fourth conductive plug 61. This fourth conductive plug 61 is connected electrically to the first n-type impurity diffusion region 45a via the first conductive plug 49.

Figure 7L:
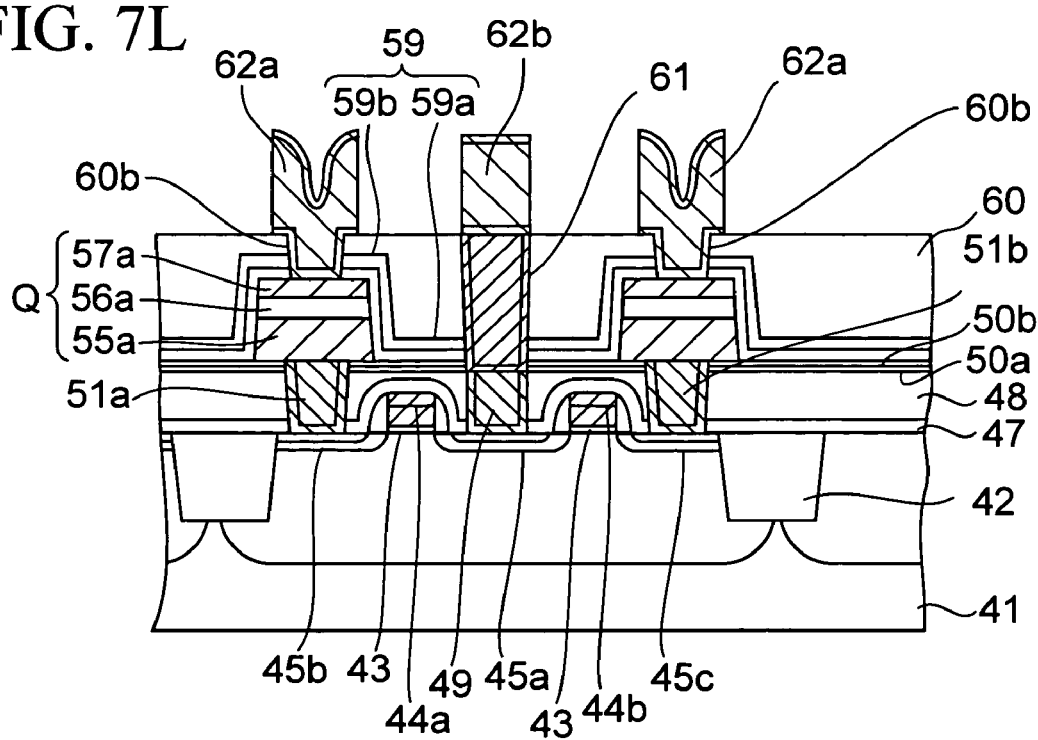

Next, steps required until a sectional structure shown in FIG. 7L is obtained will be explained hereunder.

First, as a second oxidation preventing film (not shown), an SiON film is formed on the fourth conductive plug 61 and the protection insulating film 59 by the CVD method. Then, this second oxidation preventing film, the second interlayer insulating film 60, and the protection insulating film 59 are patterned by the photolithography, and thus a contact hole 60b is formed on the upper electrode 57a of the ferroelectric capacitor Q.

A part of the protection insulating film 59 is removed from the upper electrode 57a because of the formation of the contact hole 60b, so that the capacitor ferroelectric film 56a suffers the damage through the portion. Therefore, in order to recover the capacitor ferroelectric film 56a from this damage, the recovery annealing is applied to the ferroelectric capacitor Q. This recovery annealing is executed for 60 minute in the oxygen atmosphere at a substrate temperature of 550° C., for example.

Then, the oxidation preventing film formed on the second interlayer insulating film 60 is removed by the etching-back and also a surface of the fourth conductive plug 61 is exposed.

Then, a multi-layered metal film is formed in the contact holes 60b on the upper electrodes 57a of the ferroelectric capacitors Q and on the second interlayer insulating film 60. Then, first-layer metal wirings 62a each connected to the upper electrode 57a via the contact hole 60b and a conductive pad 62b connected to the fourth conductive plug 61 are formed by patterning the multi-layered metal film. As this multi-layered metal film, a structure obtained by forming sequentially a Ti film of 60 nm thickness, a TiN film of 30 nm thickness, an Al—Cu film of 400 nm thickness, a Ti film of 50 nm thickness, and a TiN film of 70 nm thickness, for example, is employed.

Then, a third interlayer insulating film (not shown) is formed on the second interlayer insulating film 60, the first-layer metal wirings 62a, and the conductive pad 62b. Then, a fifth conductive plug connected electrically to the fourth conductive plug 61 is formed in a hole in the third interlayer insulating film. But their detailed explanation will be omitted herein.

With the above, a basic structure of the FeRAM according to the present embodiment is completed.

According to such FeRAM, the lower protection insulating film 59a is formed of the BST film that has the narrower energy band gap Eg than the upper protection insulating film 59b. Therefore, as explained in the first embodiment, the adhesive strength of the protection insulating film 59 to the upper electrode 57a can be enhanced rather than the case where the lower protection insulating film 59a is formed of the material that has the wide energy band gap Eg. As a result, the film peeling of the protection insulating film 59 can be suppressed effectively, whereby such an event can be prevented that the capacitor ferroelectric film 56a is exposed to the harmful atmosphere containing the hydrogen and the moisture and also the ferroelectric characteristic of the ferroelectric capacitors Q can be satisfactorily maintained.

(5) Fourth Embodiment

In the present embodiment, the protection insulating film having the double-layered structure explained in the first embodiment is applied to DRAM (Dynamic Random Access Memory).

FIGS. 8A to 8J are sectional views showing a semiconductor device according to a fourth embodiment of the present invention in the manufacturing process.

Figure 8A:
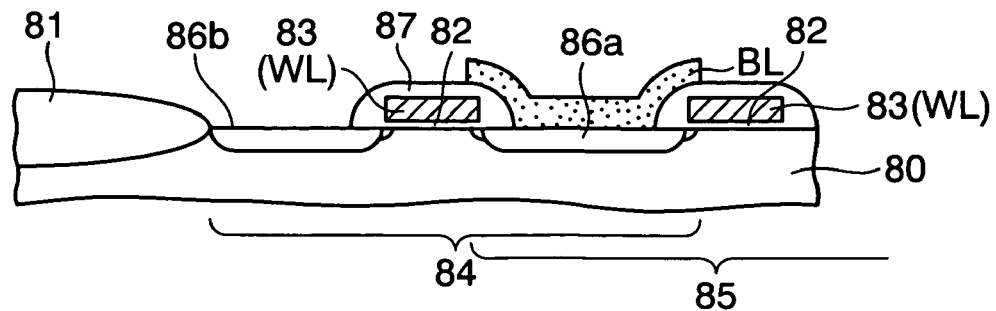
FIGS. 8A to 8J are sectional views showing a semiconductor device according to a fourth embodiment of the present invention in the manufacturing process.

First, as shown in FIG. 8A, a field oxide film is formed around the transistor forming region on a surface of a silicon substrate 80 by the LOCOS method. This film is used as an element isolation insulating film 81. Then, gate electrodes 83 of MOS transistors 84, 85 are formed in the transistor forming region via a gate insulating film 82. This gate electrode 83 is extended onto the element isolation insulating film 81, and is also used as the word line (WL). Also, first and second n-type impurity diffusion regions 86a, 86b serving as the source/drain regions of the MOS transistors 84, 85 are formed on both sides of the gate electrode 83. Out of these impurity diffusion regions, the first n-type impurity diffusion region 86a is used commonly to the MOS transistors 84, 85, and the bit line BL is connected to an upper surface of this impurity diffusion region 86a. In this case, the gate electrodes 83 are covered with an insulating film 87 made of silicon dioxide, or the like.

Figure 8B:
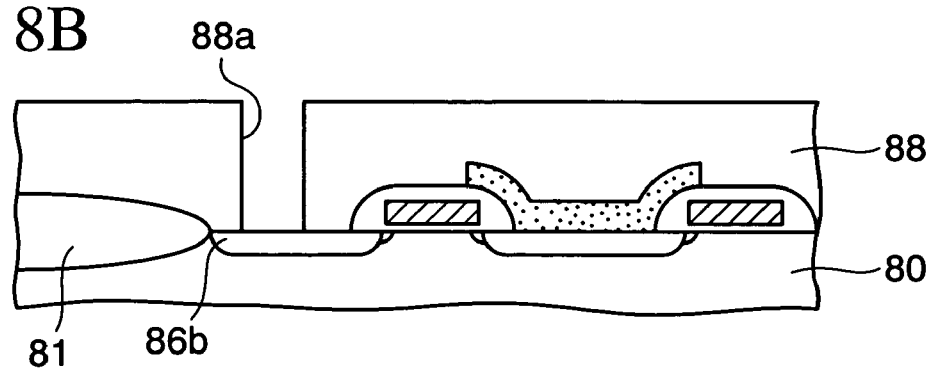

In such condition, as shown in FIG. 8B, the MOS transistors 84, 85 and the element isolation insulating film 81 are covered with a first interlayer insulating film 88 made of silicon dioxide, or the like. Then, a hole 88a is formed on the second n-type impurity diffusion region 86b to which the bit line BL of the MOS transistors 84, 85 is not connected. In this case, the first interlayer insulating film 88 acts as an underlying insulating film applied to the capacitor described later.

Figure 8C:
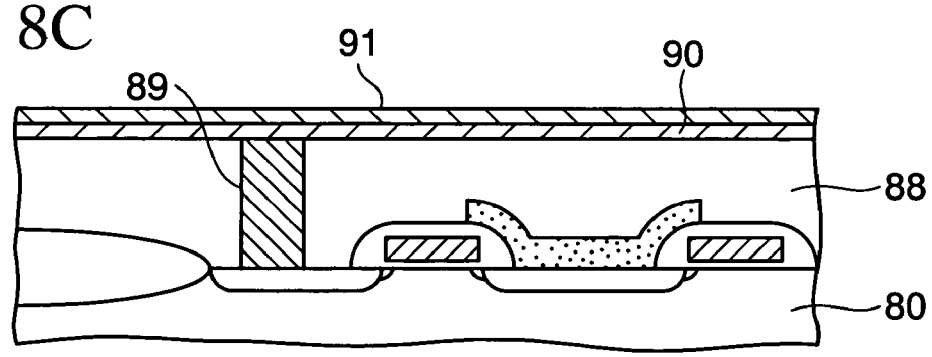

Then, as shown in FIG. 8C, a conductive plug 89 made of tungsten or polysilicon is formed in the hole 88a. Then, a titanium (Ti) film 90 and a titanium nitride (TiN) film 91 are formed in this order on the first interlayer insulating film 88 and the conductive plug 89 by the sputtering method. The titanium film 90 and the titanium nitride film 91 function as a barrier metal.

Figure 8D:
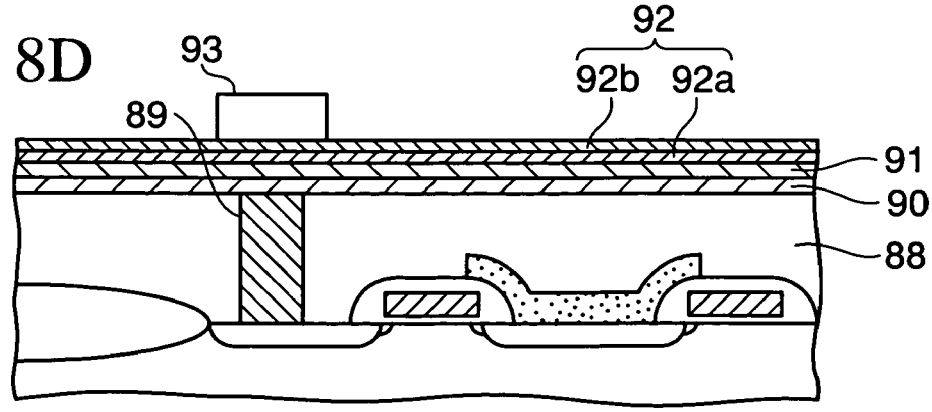

Then, as shown in FIG. 8D, a ruthenium (Ru) film 92a and a ruthenium oxide ($RuO_2$) film 92b are formed in this order on the titanium nitride film 91. These films constitute a first conductive film 92. A thickness of this first conductive film 92 is about 100 nm, for example. Then, a first resist pattern 93 that is shaped into a lower electrode is formed on the first conductive film 92.

Figure 8E:
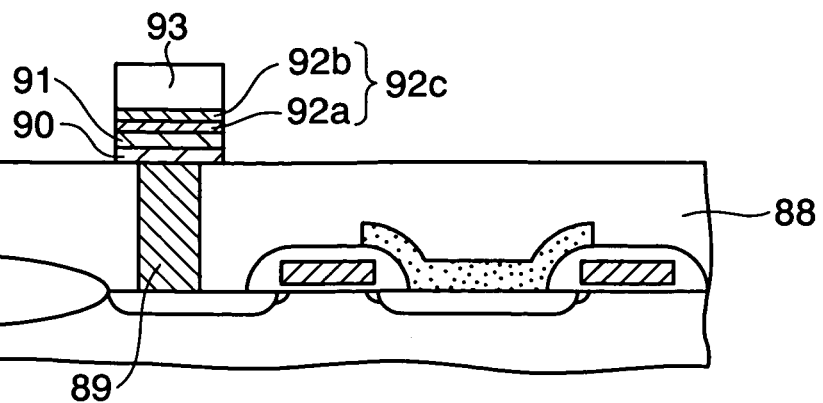

Then, as shown in FIG. 8E, the first conductive film 92 is etched by the ion milling, while using the first resist pattern 93 as a mask. Thus, a lower electrode 92c consisting of the ruthenium film 92a and the ruthenium oxide film 92b is formed. The titanium nitride film 91 and the titanium film 90 are etched by this ion milling, whereby these films are left only under the lower electrode 92c.

Then, the first resist pattern 93 is removed.

Figure 8F:
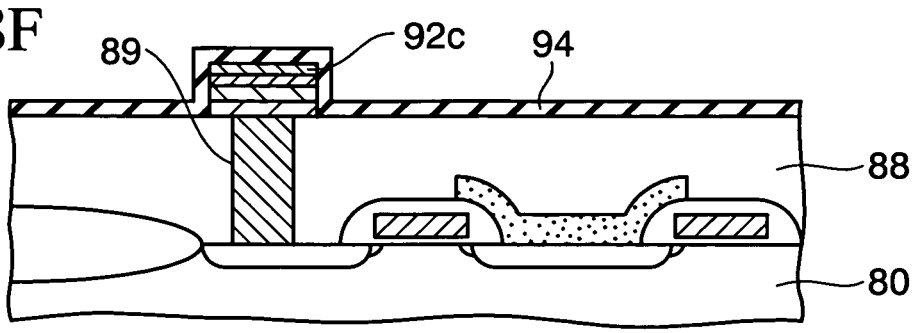

Then, as shown in FIG. 8F, a high-dielectric film made of $Ba_{0.7}Sr_{0.3}TiO_3$ (BST), or the like and having a thickness of about 80 nm is formed on the lower electrode 92c and the first interlayer insulating film 88 by the RF magnetron sputtering method. This film is used as a dielectric film 94.

Figure 8G:
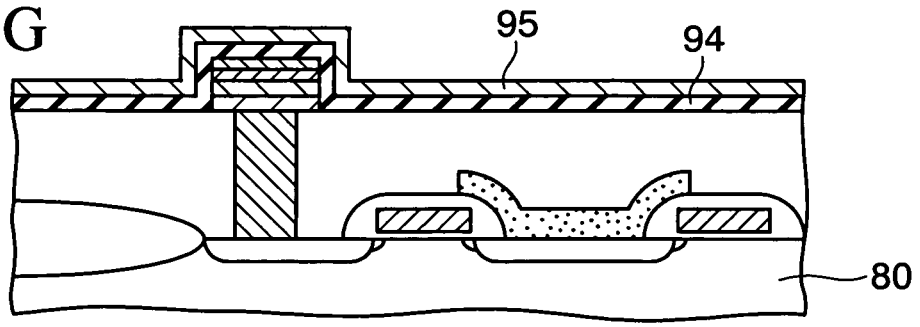

Then, as shown in FIG. 8G, a ruthenium film of about 80 nm thickness is formed on the dielectric film 94 by the sputtering method. This film is used as a second conductive film 95. In this event, the second conductive film 95 is not limited to the ruthenium film. A ruthenium oxide film or a laminated film consisting of the ruthenium film and the ruthenium oxide film may be formed as the second conductive film 95.

Figure 8H:
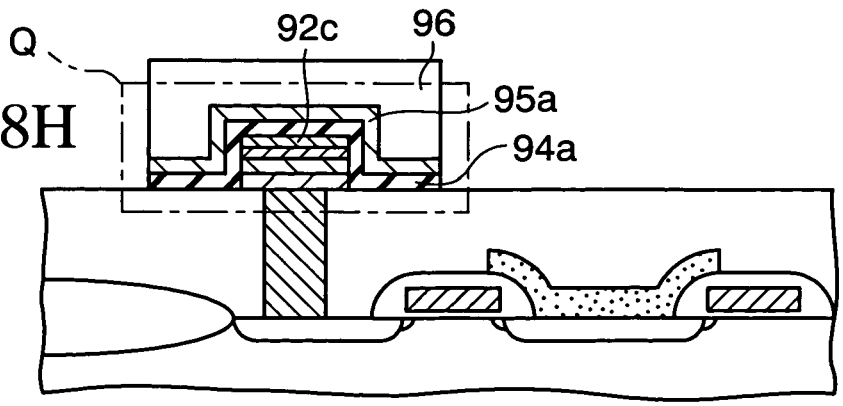

Then, as shown in FIG. 8H, a second resist pattern 96 that is shaped into the upper electrode is formed on the second conductive film 95. Then, the second conductive film 95 and the dielectric film 94 are etched by the ion milling while using the second resist pattern 96 as a mask. Accordingly, an upper electrode 95a and a capacitor dielectric film 94a both having a wider area than the lower electrode 92c are formed, and thus a high-dielectric capacitor Q consisting of these elements can be obtained.

Then, the second resist pattern 96 is removed.

Figure 8I:
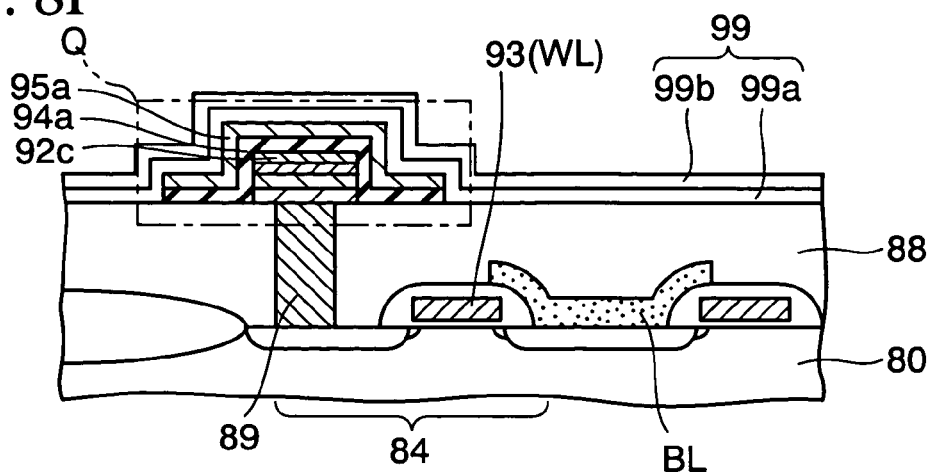

Then, as shown in FIG. 8I, as a lower protection insulating film 99a for covering the high-dielectric capacitor Q, the BST film having the relatively narrow energy band gap Eg such as about 3.2 eV and having a thickness of about 20 nm is formed on the first interlayer insulating film 88 and the upper electrode 95a by the sputtering method respectively.

In addition, an alumina film having the wider energy band gap Eg such as 10 eV than the lower protection insulating film 99a and having a thickness of about 50 nm is formed on the lower protection insulating film 99a by the sputtering method. This film is used as an upper protection insulating film 99b.

As a result, the high-dielectric capacitor Q is covered with a protection insulating film 99 having the double-layered structure that consists of the lower protection insulating film 99a and the upper protection insulating film 99b. Thus, the high-dielectric capacitor Q is protected from the atmosphere containing the hydrogen or the moisture that causes the capacitor dielectric film 94a to deteriorate in the manufacturing process or in actual use.

Figure 8J:
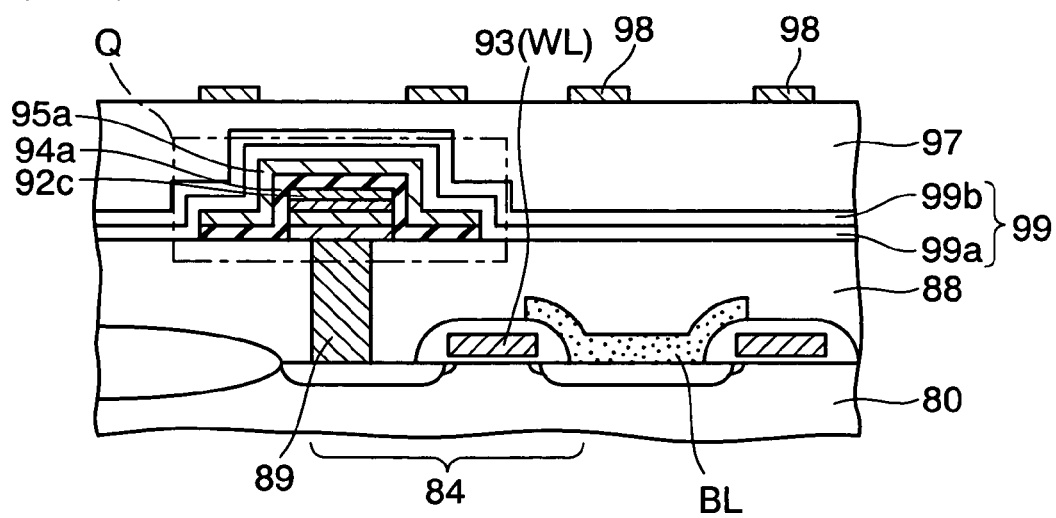

Then, as shown in FIG. 8J, a silicon dioxide film of about 200 nm thickness is formed on an overall surface by the plasma CVD method using the silane as a reaction gas. This film is used as a second interlayer insulating film 97. Then, a metal film containing the aluminum mainly is formed on the second interlayer insulating film 97, and then metal wirings 98 are formed by patterning the metal film.

With the steps executed up to now, a basic structure of the DRAM according to the present embodiment is completed.

According to the present embodiment described above, the protection insulating film 99 for protecting the high-dielectric capacitor Q is formed to have the double-layered structure that consists of the lower protection insulating film 99a having the narrow energy band gap Eg and the upper protection insulating film 99b having the wider energy band gap Eg than that of the lower protection insulating film 99a.

The lower protection insulating film 99a takes the role that makes the protection insulating film 99 difficult to come off the upper electrode 95a because its adhesive strength to the underlying upper electrode 95a is enhanced by its the narrow energy band gap Eg. Meanwhile, the upper protection insulating film 99b functions to make up for the insufficient barrier characteristic that is given by the lower protection insulating film 99a solely, and also functions to protect the high-dielectric capacitor Q from the atmosphere containing the hydrogen or the moisture that is harmful to the capacitor dielectric film 94a. As a consequence, according to the present embodiment, the prevention of the film peeling of the protection insulating film 99 and the improvement of the barrier characteristic can be satisfied at the same time and also the DRAM the high-dielectric characteristic of which can be maintained satisfactorily in the manufacturing process or in actual use can be provided.

According to the present invention, the protection insulating film for protecting the capacitor is formed as the double-layered structure consisting of the lower protection insulating film and the upper protection insulating film, and also the energy band gap of the lower protection insulating film is set wider than that of the upper protection insulating film. Therefore, the adhesive strength between the protection insulating film and the capacitor upper electrode can be improved and also the capacitor can be protected without fail by the protection insulating film.

What is claimed is:

1. A capacitive element comprising:
   a capacitor constructed by forming a lower electrode, a capacitor dielectric film, and an upper electrode sequentially on a base member;
   a lower protection insulating film formed on the upper electrode to cover at least a part of the capacitor; and
   an upper protection insulating film formed on the lower protection insulating film and having a wider energy band gap than the lower protection insulating film.

2. A capacitive element according to claim 1, wherein the energy band gap of the lower protection insulating film is equal to or more than 2.5 eV and equal to or less than 5.5 eV, and the energy band gap of the upper protection insulating film is equal to or more than 5.5 eV and equal to or less than 11 eV.

3. A capacitive element according to claim 1, wherein a thickness of the upper protection insulating film is larger than a thickness of the lower protection insulating film.

4. A capacitive element according to claim 1, wherein a thickness of the lower protection insulating film and the upper protection insulating film is more than or equal to 1 nm and less than or equal to 1000 nm respectively.

5. A capacitive element according to claim 1, wherein the lower protection insulating film is a BST film or a PZT film.

6. A capacitive element according to claim 1, wherein the upper protection insulating film is any one of an alumina film, a silicon nitride film, and a silicon oxide film.

7. A capacitive element according to claim 1, wherein the upper electrode is formed of a noble metal.

8. A capacitive element according to claim 7, wherein the noble metal is any one of gold, silver, copper, platinum, palladium, iridium, ruthenium, and rhodium.

9. A capacitive element according to claim 1, wherein the upper electrode is formed of any one of rhenium, platinum oxide ($PtO_x$), iridium oxide ($IrO_x$), and ruthenium oxide ($RuO_x$).

10. A capacitive element according to claim 1, wherein the lower electrode is formed of any one of gold, platinum, palladium, iridium, ruthenium, rhodium, rhenium, osmium, copper, platinum oxide ($PtO_x$), iridium oxide ($IrO_x$), and ruthenium oxide ($RuO_x$).

11. A capacitive element according to claim 1, wherein an underlying insulating film is formed on the base member, and the lower electrode is formed on the underlying insulating film, and the underlying insulating film is either a single-layer film consisting of any one of a silicon oxide film, a silicon nitride film, an insulating metal oxide film, and a xerogel, or a laminated film consisting of any combination of these films.

12. A capacitive element according to claim 11, wherein an adhesive film is formed between the underlying insulating film and the lower electrode.

13. A capacitive element according to claim 12, wherein the adhesive film is either a single-layer film consisting of any one of a gold film, an iridium film, a zirconium film, a titanium film, a titanium oxide ($TiO_x$) film, an iridium oxide ($IrO_x$) film, a platinum oxide ($PtO_x$) film, a zirconium oxide ($ZrO_x$) film, a titanium nitride (TiN) film, a titanium aluminum nitride (TiAlN) film, a tantalum nitride (TaN) film, and a tantalum silicon nitride (TaSiN) film, or a laminated film consisting of any combination of these films.

14. A capacitive element according to claim 1, wherein the base member is a semiconductor substrate.

15. A capacitive element according to claim 1, wherein the capacitor is a decoupling capacitor.

16. A semiconductor device comprising:
a semiconductor substrate;
an underlying insulating film formed on the semiconductor substrate;
a capacitor constructed by forming a lower electrode, a capacitor dielectric film, and an upper electrode sequentially on the underlying insulating film;
a lower protection insulating film formed on the upper electrode to cover at least a part of the capacitor; and
an upper protection insulating film formed on the lower protection insulating film and having a wider energy band gap than the lower protection insulating film.

17. A semiconductor device according to claim 16, wherein the capacitor is a ferroelectric capacitor of an FeRAM (Ferroelectric Random Access Memory) or a high-dielectric capacitor of a DRAM (Dynamic Random Access Memory).

* * * * *